United States Patent
Higashibeppu et al.

(10) Patent No.: US 9,873,248 B2
(45) Date of Patent: Jan. 23, 2018

(54) PIEZOELECTRIC ELEMENT, PIEZOELECTRIC MEMBER, LIQUID DISCHARGE HEAD, AND RECORDING DEVICE EACH USING PIEZOELECTRIC ELEMENT

(71) Applicant: KYOCERA Corporation, Kyoto-shi, Kyoto (JP)

(72) Inventors: Makoto Higashibeppu, Kirishima (JP); Shuuhei Tabata, Kirishima (JP); Tomonori Eguchi, Kagoshima (JP); Izuru Sato, Kirishima (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 15/039,987

(22) PCT Filed: Nov. 28, 2014

(86) PCT No.: PCT/JP2014/081593
§ 371 (c)(1),
(2) Date: May 27, 2016

(87) PCT Pub. No.: WO2015/080256
PCT Pub. Date: Jun. 4, 2015

(65) Prior Publication Data
US 2017/0036445 A1     Feb. 9, 2017

(30) Foreign Application Priority Data

Nov. 28, 2013  (JP) ................................. 2013-246247
Mar. 24, 2014  (JP) ................................. 2014-060148

(51) Int. Cl.
*H01L 41/18*     (2006.01)
*B41J 2/14*      (2006.01)
(Continued)

(52) U.S. Cl.
CPC ....... *B41J 2/14201* (2013.01); *B41J 2/14233* (2013.01); *B41J 2/155* (2013.01);
(Continued)

(58) Field of Classification Search
CPC .............. H01L 41/0973; H01L 41/1873; B41J 2/14201; B41J 2/14233; B41J 2/155;
(Continued)

(56) References Cited

U.S. PATENT DOCUMENTS

2004/0046481 A1   3/2004  Takeuchi et al.
2004/0058797 A1   3/2004  Nonoyama et al.
(Continued)

FOREIGN PATENT DOCUMENTS

CN       101019247 A     8/2007
EP        1372199 A1    12/2003
(Continued)

OTHER PUBLICATIONS

International Search Report, PCT/JP2014/081593, dated Mar. 3, 2015, 2 pgs.
(Continued)

*Primary Examiner* — J. San Martin
(74) *Attorney, Agent, or Firm* — Volpe and Koenig, P.C.

(57) ABSTRACT

The present invention aims at providing a piezoelectric element with less characteristic variations with time, and a liquid discharge head and a recording device each using the piezoelectric element. The piezoelectric element 30 of the present invention is the piezoelectric body 30 (piezoelectric ceramic layer 21b) containing a potassium sodium niobate composition as a primary component. The piezoelectric body extends in a planar direction. A compressive stress is applied in the planar direction. A phase transition point between a tetragonal crystal system and an orthorhombic crystal system is −20° C. or below.

6 Claims, 6 Drawing Sheets

(51) Int. Cl.
- *B41J 2/155* (2006.01)
- *H01L 41/09* (2006.01)
- *H01L 41/187* (2006.01)

(52) U.S. Cl.
CPC ...... *H01L 41/0973* (2013.01); *H01L 41/1873* (2013.01); *B41J 2002/14403* (2013.01); *B41J 2002/14459* (2013.01); *B41J 2202/20* (2013.01)

(58) Field of Classification Search
CPC .... B41J 2002/14403; B41J 2002/14459; B41J 2201/20
USPC .......................................................... 310/358
See application file for complete search history.

(56) References Cited

U.S. PATENT DOCUMENTS

| | | | |
|---|---|---|---|
| 2007/0159028 A1* | 7/2007 | Nagaya | C01G 33/00 310/358 |
| 2007/0228874 A1* | 10/2007 | Nagaya | C01G 33/006 310/315 |
| 2012/0019108 A1* | 1/2012 | Tanaka | C04B 35/495 310/366 |
| 2012/0091389 A1* | 4/2012 | Madaro | C01G 33/00 252/62.9 R |

FOREIGN PATENT DOCUMENTS

| | | |
|---|---|---|
| EP | 1382588 A1 | 1/2004 |
| JP | 2004-244300 A | 9/2001 |
| JP | 2007-290374 A | 11/2007 |
| JP | 2010-225705 A | 10/2010 |
| JP | 2011-195382 A | 10/2011 |
| WO | 02/073710 A1 | 9/2002 |

OTHER PUBLICATIONS

Chinese Office Action with English concise explanation, Chinese Patent Application No. 201480064703.9, dated Oct. 9, 2016, 7 pgs.

* cited by examiner

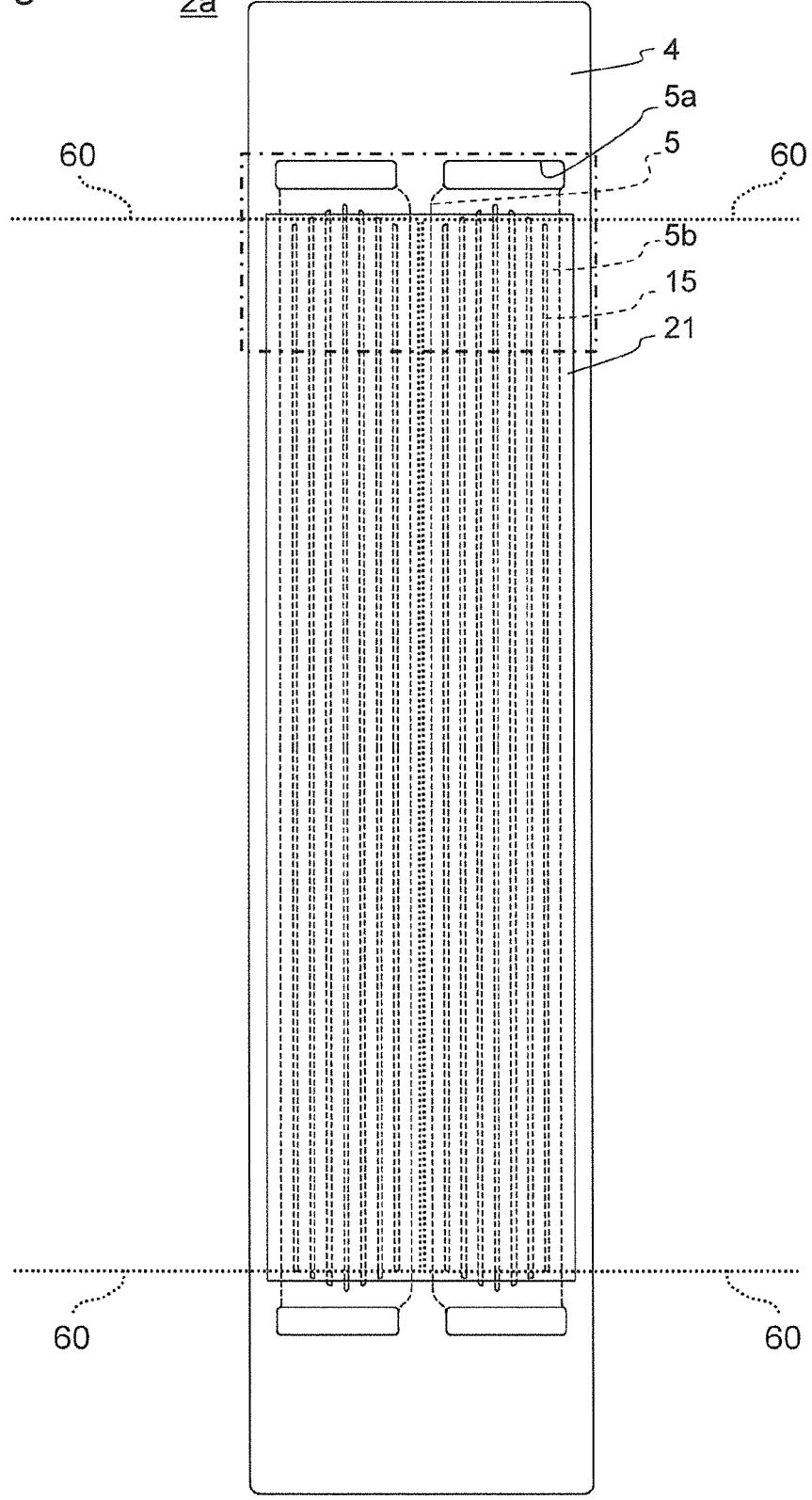

PIEZOELECTRIC ELEMENT, PIEZOELECTRIC MEMBER, LIQUID DISCHARGE HEAD, AND RECORDING DEVICE EACH USING PIEZOELECTRIC ELEMENT

TECHNICAL FIELD

The present invention relates to a piezoelectric element, a piezoelectric member, a liquid discharge head, and a recording device, each of which uses the piezoelectric element.

BACKGROUND ART

As a liquid discharge head, there has conventionally been known, for example, a liquid discharge head that carries out various kinds of printings by discharging a liquid onto a recording medium. The liquid discharge head discharges the liquid by applying pressure to the liquid in a pressurizing chamber with the use of, for example, a potassium sodium niobate (KNN)-based piezoelectric element (for example, refer to Patent Document 1).

PRIOR ART DOCUMENT

Patent Document

Patent Document 1: Brochure of WO 02/073710

SUMMARY OF THE INVENTION

Problems to be Solved by the Invention

When the liquid discharge head is configured by laminating a flat plate shaped piezoelectric actuator substrate and a flat plate shaped flow channel member, a thermosetting adhesive may be used for the reason, for example, that resistance to the liquid to be discharged is needed. As the flow channel member, a metal flow channel member is used, which often has a larger coefficient of thermal expansion than the piezoelectric actuator substrate. Therefore, the piezoelectric actuator substrate is subjected to a compressive stress in a planar direction after passing through a heat-curing adhesion process. With a lead zirconate titanate (PZT)-based piezoelectric material, it is possible to reduce deterioration in displacement when a displacement element that is a piezoelectric element is repetitively driven by being subjected to the compressive stress. However, there has been a problem that this effect cannot sufficiently be obtained with the KNN-based piezoelectric material.

More generally speaking, this is the problem that when the KNN-based piezoelectric material is used under the compressive stress, characteristic variations with time becomes large.

Means for Solving the Problems

A piezoelectric element of the present invention is a piezoelectric element including a piezoelectric body composed mainly of a potassium sodium niobate composition. The piezoelectric body extends in a planar direction and is subjected to a compressive stress in the planar direction. A phase transition point between a tetragonal crystal system and an orthorhombic crystal system is −20° C. or below.

A piezoelectric member of the present invention includes the piezoelectric element, and a support body that is connected to the piezoelectric body and has a larger coefficient of thermal expansion than the piezoelectric body.

A liquid discharge head of the present invention includes a flow channel member including a plurality of discharge holes and a plurality of pressurizing chambers respectively connected to the discharge holes, and a piezoelectric actuator substrate including a plurality of the piezoelectric elements to respectively pressurize a liquid in the pressurizing chambers. The piezoelectric body extends over the pressurizing chambers.

A recording device of the present invention includes the liquid discharge head, a transport section to transport a recording medium to the liquid discharge head, and a control section to control the liquid discharge head.

Effect of the Present Invention

With the piezoelectric element of the present invention, a phase transition point is −20° C. that is lower than an operating temperature, making it possible to minimize characteristic variations even used under the compressive stress applied to the piezoelectric body.

BRIEF DESCRIPTION OF THE DRAWINGS

FIG. 2 is a plan view of a head body that is a main part of the liquid discharge head of FIG. 1;

EMBODIMENTS FOR CARRYING OUT THE INVENTION

Figure 1A:
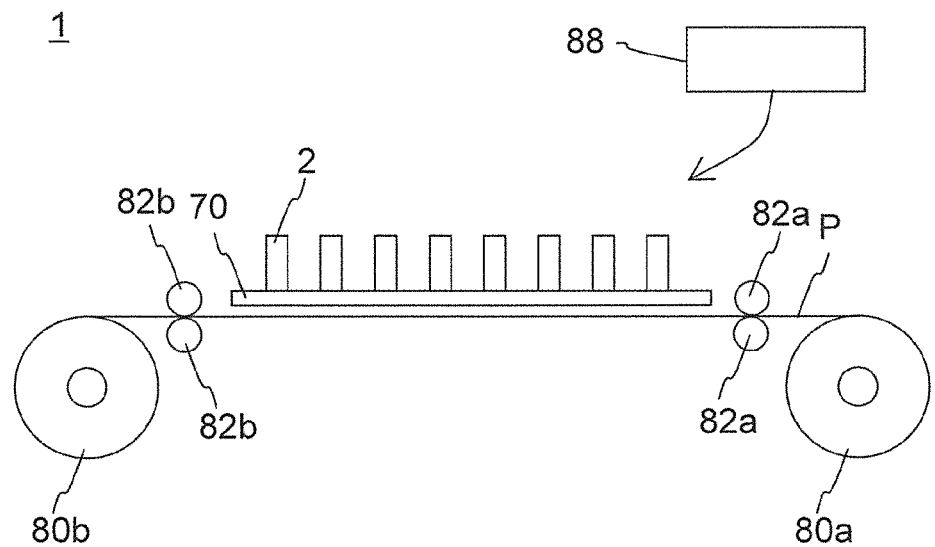
FIG. 1(a) is a side view of a recording device including a liquid discharge head according to an embodiment of the present invention.
Figure 1B:
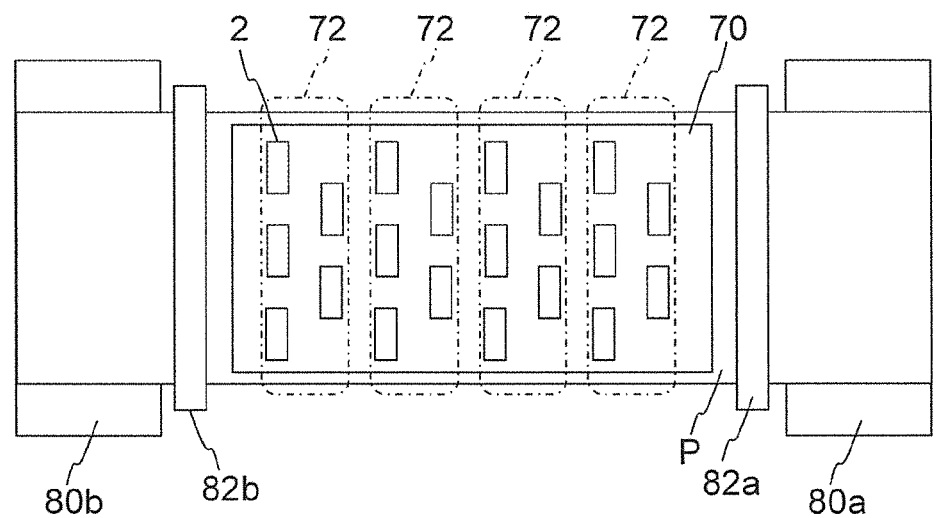
FIG. 1(b) is a plan view thereof.

FIG. 1(a) is a schematic side view of a color inkjet printer 1 (hereinafter also referred to simply as the printer) that is a recording device including a liquid discharge head 2 according to an embodiment of the present invention. FIG. 1(b) is a schematic plan view thereof. The printer 1 relatively moves a printing paper P that is a recording medium with respect to the liquid discharge head 2 by transporting the printing paper P from a transport roller 80a to a transport roller 80b. A control section 88 controls the liquid discharge head 2 on the basis of image data and character data so as to cause a liquid to be discharged toward the recording medium P and cause liquid drops to land on the printing paper P, thereby performing recording, such as printing, on the printing paper P.

In the present embodiment, the liquid discharge head 2 is fixed to the printer 1, and the printer 1 is a so-called line printer. Examples of other embodiments of the recording device of the present invention include a so-called serial printer that alternately performs an operation of moving, such as reciprocating, the liquid discharge head 2 in a direction intersecting with, for example, approximately orthogonal to a transport direction of the printing paper P, and a transport of the printing paper P.

A flat plate shaped head mounting frame 70 (hereinafter also referred to simply as the frame) is fixed to the printer 1 so as to be approximately parallel to the printing paper P. The frame 70 is provided with twenty holes (not shown), and twenty liquid discharge heads 2 are mounted on their respective corresponding hole portions. Liquid discharging portions of the liquid discharge heads 2 are configured to face the printing paper P. A distance between the liquid discharge heads and the printing paper P is set to, for example, approximately 0.5-20 mm. Five liquid discharge heads 2 constitute a head group 72, and the printer 1 has four head groups 72.

The liquid discharge heads 2 have an elongated shape that is long and narrow in a direction from a front side to a rear side in FIG. 1(a), or a vertical direction in FIG. 1(b). The elongated direction is also referred to as a longitudinal direction. Three liquid discharge heads 2 in the head group 72 are disposed along the direction intersecting with, for example, approximately orthogonal to the transport direction of the printing paper P, and the remaining two liquid discharge heads 2 are respectively disposed between the three liquid discharge heads 2 and located at positions deviated from each other along the transport direction. The liquid discharge heads 2 are disposed so that ranges respectively printable by the liquid discharge heads 2 are connected to each other in a width direction of the printing paper P (the direction intersecting the transport direction of the printing paper P), or overlapped with each other via their respective ends. This permits printing without leaving any blank space in the width direction of the printing paper P.

The four head groups 72 are disposed along the transport direction of the recording paper P. A liquid, such as ink, is supplied from a liquid tank (not shown) to each of the liquid discharge heads 2. Inks of the same color are supplied to the liquid discharge heads 2 belonging to the single head group 72, and inks of four colors are printable by the four head groups. The colors of inks to be discharged from the head groups 72 are, for example, magenta (M), yellow (Y), cyan (C), and black (K). A color image is printable by printing these inks under the control of the control section 88.

The number of the liquid discharge heads 2 mounted on the printer 1 may be one for printing over the range printable by the single liquid discharge head 2 with a single color. The number of the liquid discharge heads 2 included in the head group 72, and the number of the head groups 72 are suitably changeable according to a printing object and printing conditions. For example, the number of the head groups 72 may be increased in order to perform more multicolor printing. Even when used the liquid discharge heads 2 having the same performance, a transport velocity can be increased by disposing the head groups 72 that perform printing with the same color and cause these head groups 72 to alternately perform printing in the transport direction. This ensures a large printing area per time. Alternatively, resolution in the width direction of the printing paper P may be enhanced by preparing the head groups 72 that perform printing with the same color, and disposing these head groups 72 with a deviation in the direction intersecting the transport direction.

Besides printing colored inks, a liquid, such as coating agent, may be printed in order to carry out surface treatment of the printing paper P.

The printer 1 performs printing on the printing paper P as a recording medium. The printing paper P is being wound up onto a paper feed roller 80a. After the printing paper P passes through between two guide rollers 82a, the printing paper P passes under the liquid discharge heads 2 mounted on the frame 70, and then passes through between two transport rollers 82b, and is finally recovered onto a recovery roller 80b. When performing printing, the printing paper P is transported at a constant velocity and subjected to printing by the liquid discharged heads 2 by rotating the transport rollers 82b. The recovery roller 80b winds up the printing paper P fed out of the transport rollers 82b. The transport velocity is set to, for example, 75 m/min. Each of these rollers may be controlled by the control section 88, or may be manually operated by an operator.

The recording medium may be a roll-shaped cloth besides the printing paper P. The printer 1 may be configured to directly transport a transport belt with the recording medium mounted on the transport belt, instead of directly transporting the printing paper P. With this configuration, it is possible to employ, as a recording medium, sheet papers, cut cloths, wood, tiles, or the like. Further, for example, wiring patterns of electronic devices may be printed by causing a liquid containing conductive particles to be discharged from the liquid discharge heads 2. Furthermore, chemicals may be manufactured by causing a predetermined amount of each of a liquid chemical agent and a liquid containing a chemical agent to be discharged from the liquid discharge heads 2 toward a reaction vessel or the like, followed by a reaction therebetween.

For example, a position sensor, a velocity sensor, and a temperature sensor may be attached to the printer 1, and the control section 88 may control components of the printer 1 according to states of the components of the printer 1, which are revealed from information from these sensors. For example, when a temperature of the liquid discharge heads 2, a temperature of the liquid in the liquid tank, and a pressure applied to the liquid discharge heads 2 by the liquid in the liquid tank affect discharge characteristics of the liquid to be discharged (such as a discharge rate and a discharge velocity), it may be configured to change a drive signal for discharging the liquid in the liquid discharge heads 2 according to their respective information.

Figure 3:
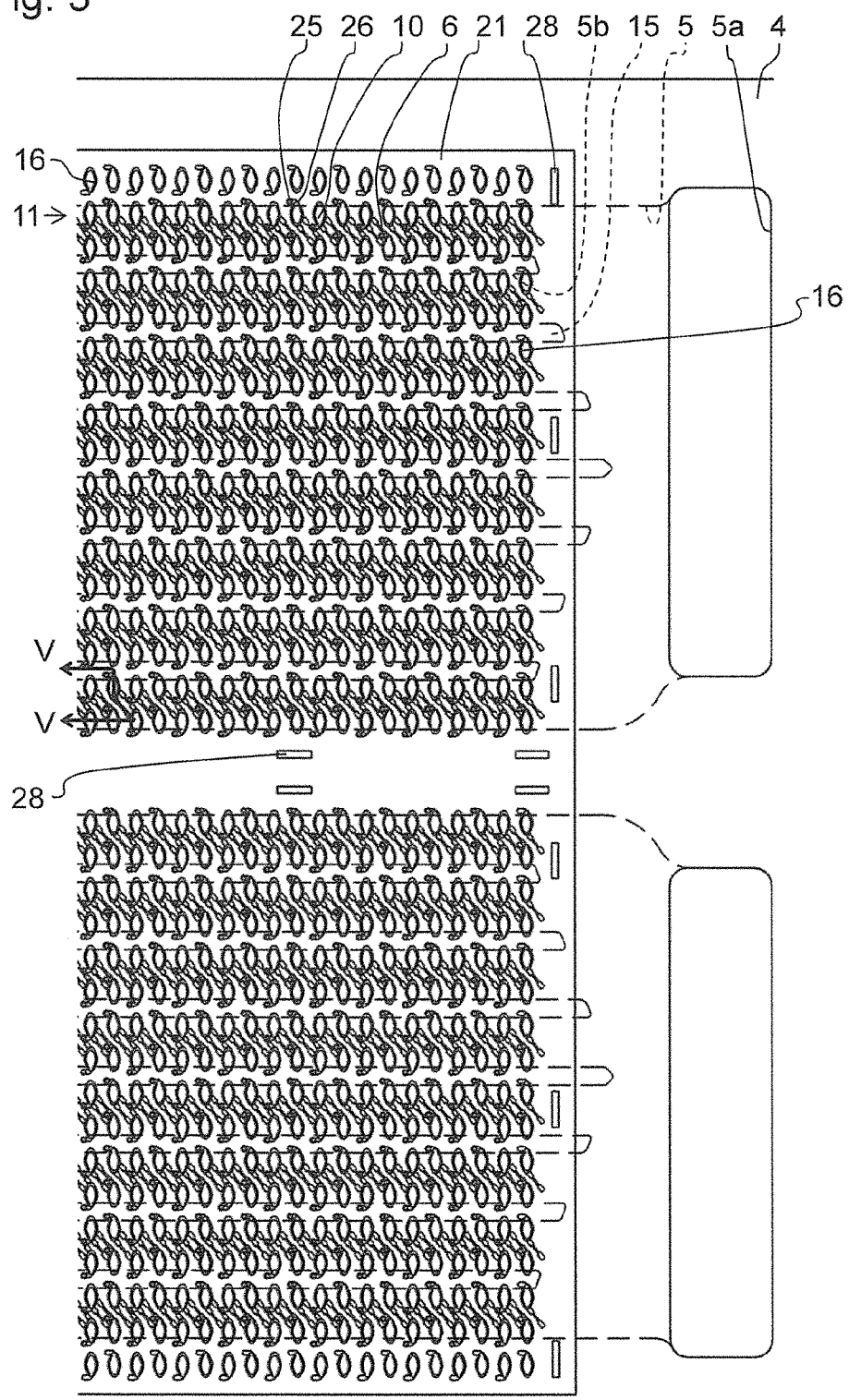
FIG. 3 is an enlarged view of a region surrounded by a chain line in FIG. 2(a), from which some of flow channels are omitted for the sake of description.
Figure 4:
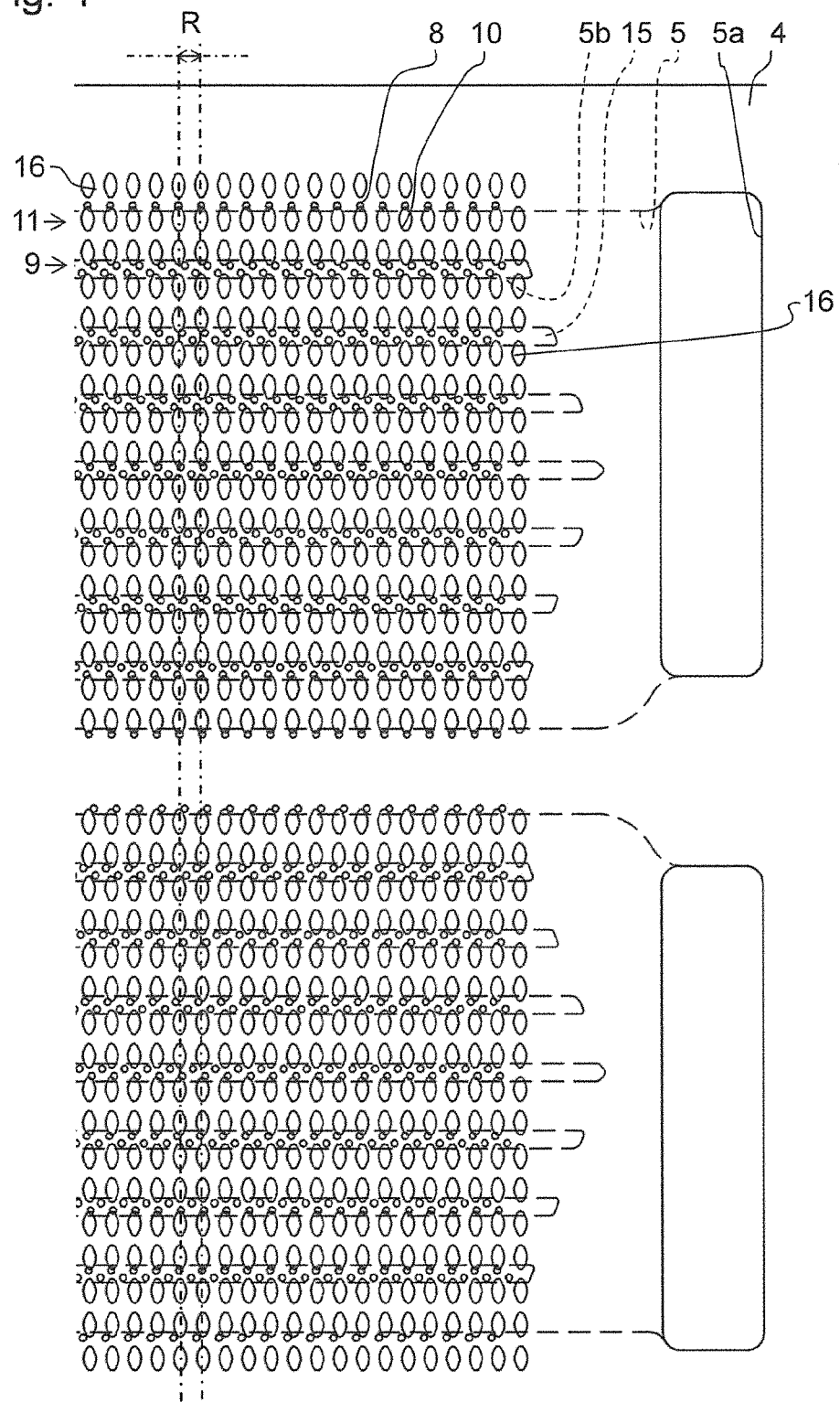
FIG. 4 is an enlarged view of the region surrounded by the chain line in FIG. 2(a), from which some of the flow channels are omitted for the sake of description.
Figure 5:
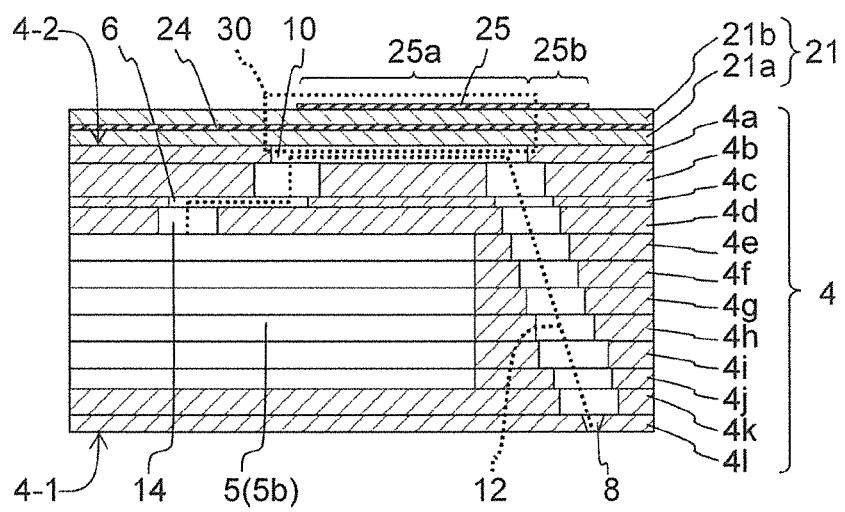
FIG. 5 is a longitudinal sectional view taken along line V-V in FIG. 3.

The liquid discharge head 2 according to the embodiment of the present invention is described below. FIG. 2 is a plan view showing a head body 2a that is a main component of the liquid discharge head 2 shown in FIG. 1. FIG. 3 is an enlarged plan view of a region surrounded by a chain line in FIG. 2, showing a part of the head body 2a. Some of flow channels are omitted in FIG. 3 for the sake of description. FIG. 4 is an enlarged plan view at the same position as in FIG. 3, in which some of the flow channels that differ from those in FIG. 3 are omitted. In FIGS. 3 and 4, for the purpose of further clarification of the drawings, pressurizing chambers 10, apertures 6, and the discharge holes 8, which are located below a piezoelectric actuator substrate 21 and therefore should be drawn by a dashed line, are drawn by a solid line. FIG. 5 is a longitudinal sectional view taken along line V-V in FIG. 3.

Each of the liquid discharge heads 2 may include, besides the head body 2a, a reservoir that supplies a liquid to the head body 2a, and a metal casing. The head body 2a includes a flow channel member 4 that is a support body, and the piezoelectric actuator substrate 21 in which displacement elements 30 as piezoelectric elements are fabricated.

The flow channel member 4 constituting the head body 2a includes a manifold 5 that is a common flow channel, a plurality of pressurizing chambers 10 respectively connected to the manifold 5, and a plurality of discharge holes 8 respectively connected to the pressurizing chambers 10.

The pressurizing chambers 10 open into an upper surface of the flow channel member 4, and the upper surface of the flow channel member 4 serves as a pressurizing chamber surface 4-2. The upper surface of the flow channel member 4 has an opening 5a being connected to the manifold 5. The liquid is to be supplied through the opening 5a.

The piezoelectric actuator substrate 21 including the displacement elements 30 is connected to the upper surface of the flow channel member 4, and the displacement elements 30 are disposed so as to be located on the pressurizing chambers 10. A signal transmission section 60, such as an FPC (flexible printed circuit), for supplying signals to the displacement elements 30 is connected to the piezoelectric actuator substrate 21. In FIG. 2, to make clear a state in which two signal transmission sections 60 are connected to the piezoelectric actuator substrate 21, an external form of regions of the signal transmission sections 60 which are connected to the piezoelectric actuator substrate 21 is indicated by a dotted line. Electrodes formed on the signal transmission sections 60, which are electrically connected to the piezoelectric actuator substrate 21, are disposed in a rectangular form at end portions of the signal transmission sections 60. The two signal transmission sections 60 are connected so that their respective ends reach a middle part of the piezoelectric actuator substrate 21 in a transverse direction thereof. The two signal transmission sections 60 extend from the middle part toward long sides of the piezoelectric actuator substrate 21.

The head body 2a has the single piezoelectric actuator substrate 21 including the flat plate shaped flow channel member 4 and the displacement elements 30 connected onto the flow channel member 4. A planar shape of the piezoelectric actuator substrate 21 is a rectangular shape, and the piezoelectric actuator substrate 21 is disposed on the upper surface of the flow channel member 4 so that the long sides of the rectangular shape extend along the longitudinal direction of the flow channel member 4.

Two manifolds 5 are formed inside the flow channel member 4. The manifolds 5 have an elongated shape that extends from one end in the longitudinal direction of the flow channel member 4 to the other end, and are respectively provided with openings 5a of the manifolds 5 that open at both ends thereof into the upper surface of the flow channel member 4.

The manifolds 5 are partitioned at a central portion in the longitudinal direction, which is a region connected to at least the pressurizing chamber 10, by partition walls 15 disposed with a distance therebetween in the transverse direction. The partition walls 15 have the same height as the manifolds 5 and completely partition the manifolds 5 into a plurality sub manifolds 5b, at a central portion in the longitudinal direction which is a region connected to the pressurizing chamber 10. With this configuration, the discharge holes 8 and the flow channels connected from the discharge holes 8 to the pressurizing chamber 10 can be disposed so as to be overlapped with the partition walls 15 in a plan view.

The flow channel member 4 is formed with the pressurizing chambers 10 extending two-dimensionally. The pressurizing chambers 10 are hollow regions having a planar form of an approximately rhombus shape whose corners are rounded, or an elliptical shape.

The pressurizing chambers 10 are connected to one another through the sub manifold 5b and an individual supply flow channel 14. There is one pressurizing chamber row 11 that is a row of the pressurizing chambers 10 connected to the sub manifold 5b so as to extend along the sub manifold 5b on each of both sides of the sub manifold 5b, namely, there are a total of two pressurizing chamber rows. Accordingly, 16 pressurizing chamber rows 11 are disposed with respect to the single manifold 5, and a total of 32 pressurizing chamber rows 11 are disposed over the entirety of the head body 2a. All of the pressurizing chambers 10 in these pressurizing chamber rows 11 are disposed at identical intervals in the longitudinal direction, for example, at intervals of 37.5 dpi.

The pressurizing chambers 10 connected to the single manifold 5 are disposed in a lattice form that makes rows and columns along outer sides of the piezoelectric actuator substrate 21 having a rectangular shape. Consequently, individual electrodes 25 formed from the outer sides of the piezoelectric actuator substrate 21 onto the pressurizing chambers 10 are disposed at equal intervals. Therefore, the piezoelectric actuator substrate 21 is less subjected to a deformation when forming the individual electrodes 25. When connecting the piezoelectric actuator substrate 21 and the flow channel member 4, a large deformation may lead to a risk that stress is applied to the displacement elements 30 close to the outer sides and variations occur in displacement characteristics. However, the variations can be reduced by minimizing the deformation. It is further insusceptible to the influence of the deformation owing to a dummy pressurizing chamber row of dummy pressurizing chambers 16 disposed outside the pressurizing chamber rows 11 closest to the outer sides. The pressurizing chambers 10 belonging to the pressurizing chamber row 11 are disposed at equal intervals, and the individual electrodes 25 corresponding to the pressurizing chamber row 11 are also disposed at equal intervals. The pressurizing chamber rows 11 are disposed at equal intervals in the traverse direction, and rows of the individual electrodes 25 corresponding to the pressurizing chamber rows 11 are also disposed at equal intervals in the traverse direction. This eliminates portions particularly subjected to influence of crosstalk.

Although the pressurizing chambers 10 are disposed in the lattice form in the present embodiment, the pressurizing chambers 10 in the pressurizing chamber rows 11 adjacent to each other may be disposed in a zigzag form so as to locate alternately with each other. This contributes to further increasing a distance between the pressurizing chambers 10 belonging to the adjacent pressurizing chamber row 11, thereby further reducing crosstalk.

Regardless of how the pressurizing chamber rows 11 are disposed, the crosstalk is reducible by disposing so that the pressurizing chambers 10 belonging to the single pressurizing chamber row 11 are not overlapped with the pressurizing chambers 10 belonging to the adjacent pressurizing chamber row 11 in the longitudinal direction of the liquid discharge head 2 when the flow channel member 4 is viewed from above. Meanwhile a large distance between the pressurizing chamber rows 11 increases the width of the liquid discharge head 2. Therefore, accuracy of a mounting angle of the liquid discharge heads 2 with respect to the printer 1, and accuracy of a relative position of the liquid discharge heads 2 when using the liquid discharge heads 2 exert a large influence on a printing result. Therefore, by making a width of the partition walls 15 smaller than the sub manifold 5b, the influence on the printing result exerted by their respective accuracies is reducible.

The pressurizing chambers 10 connected to the single sub manifold 5b constitute two columns of the pressurizing chamber rows 11, and the discharge holes 8 connected from the pressurizing chambers 10 belonging to the single pressurizing chamber row 11 constitute a discharge hole row 9. The discharge holes 8 connected to the pressurizing chambers 10 belonging to the two pressurizing chamber rows 11 respectively open into different sides of the sub manifold 5b. In FIG. 4, the two discharge hole rows 9 are disposed on the partition walls 15, and the discharge holes 9 belonging to each of the discharge hole rows 9 are connected via the pressurizing chamber 10 to the sub manifold 5b close to the discharge holes 8. When disposed so as to avoid overlapping with the discharge holes 8 connected to the adjacent sub manifold 5b via the pressurizing chamber row 11 in the longitudinal direction of the liquid discharge head 2, it is possible to reduce crosstalk between the flow channels that connect the pressurizing chambers 10 and the discharge holes 8, thereby further minimizing crosstalk. When disposed so as to avoid overlapping of the entirety of the flow channels connecting the pressurizing chambers 10 and the discharge holes 8 in the longitudinal direction of the liquid discharge head 2, crosstalk is further reducible.

A pressurizing chamber group (in the same range as the displacement element group 31) is composed of the pressurizing chambers 10 connected to the single manifold 5. There are the two manifolds 5, and accordingly there are two pressurizing chamber groups. The pressurizing chambers 10 related to discharge in the pressurizing chamber groups are disposed in the same manner, namely, disposed at positions obtainable by a parallel shift in the transverse direction. These pressurizing chambers 10 are disposed approximately over the entirety of a region of the upper surface of the flow channel members 4 which is opposed to the piezoelectric actuator substrate 21, though there is a portion having a slightly wider interval, such as that between the pressurizing chamber groups. That is, the pressurizing chamber groups formed by these pressurizing chambers 10 occupy a region having approximately the same shape as the piezoelectric actuator substrate 21. The openings of the pressurizing chambers 10 are closed by the configuration that the piezoelectric actuator substrate 21 is connected to the upper surface of the flow channel member 4.

A flow channel connected to the discharge holes 8, which open into a discharge hole surface 4-1 on a lower surface of the flow channel member 4, extends from a corner part opposed to a corner part to which an individual supply flow channel 14 of the pressurizing chambers 10 is connected. The flow channel extends in a direction away from the pressurizing chambers 10 in a plan view. More specifically, the flow channel extends with a leftward or rightward deviation in a direction along a long diagonal line of the pressurizing chamber 10, while departing in this direction. This makes it possible to dispose the discharge holes 8 at intervals of 1200 dpi as a whole, while disposing the pressurizing chambers 10 in the lattice form in which intervals in each of the pressurizing chamber rows 11 is 37.5 dpi.

In other words, when the discharge holes 8 are projected so as to be orthogonal to a virtual straight line parallel to the longitudinal direction of the flow channel member 4, 16 discharge holes 8 connected to each of the manifolds 5, namely, a total of 32 discharge holes 8 are disposed at equal intervals of 1200 dpi. This makes it possible to form an image at a resolution of 1200 dpi in the longitudinal direction as a whole, by supplying the same color ink to all of the manifolds 5. The 16 discharge holes 8 connected to the single manifold 5 is disposed at equal intervals of 600 dpi in a range R of the virtual straight line. This makes it possible to form a bicolor image at a resolution of 600 dpi in the longitudinal direction as a whole by supplying different colored inks to each of the manifolds 5. On this occasion, by using the two liquid discharge heads 2, it is possible to form a four-color image at a resolution of 600 dpi, enhance printing accuracy, and facilitate setting for printing than using the liquid discharge head that is printable at 600 dpi. The range R of the virtual straight line is covered with the discharge holes 8 connected from the pressurizing chambers 10 belonging to the single pressurizing chamber column disposed in the transverse direction of the head body 2a.

The individual electrodes 25 are respectively formed at positions opposed to the pressurizing chambers 10 on the upper surface of the piezoelectric actuator substrate 21. Each of the individual electrodes 25 includes an individual electrode body that is slightly smaller than the pressurizing chamber 10 and has a shape approximately similar to that of the pressurizing chamber 10, and an extracting electrode 25b extracted from the individual electrode body 25a. Similarly to the pressurizing chambers 10, the individual electrodes 25 constitute an individual electrode column and an individual electrode group. A surface electrode 28 for a common electrode electrically connected through a via hole to a common electrode 24 is formed on the upper surface of the piezoelectric actuator substrate 21. Two rows of the surface electrodes 28 for the common electrode are formed along the longitudinal direction at a central part in the transverse direction of the piezoelectric actuator substrate 21, and a column thereof is formed along the transverse direction at the vicinity of an end in the longitudinal direction. Although the surface electrode 28 for the common electrode shown in the drawing is intermittently formed on a straight line, the surface electrode 28 for the common electrode may be formed continuously on the straight line. The surface electrode 28 for the common electrode and the common electrode 24 are electrically connected to each other through a conductor in the via hole (not shown) disposed in a piezoelectric ceramic layer 21b.

Two signal transmission sections 60 are disposed on and connected to the piezoelectric actuator substrate 21 so that the signal transmission sections 60 respectively extend from two long sides of the piezoelectric actuator substrate 21 toward a center thereof. On that occasion, a connection electrode 26 and a connection electrode for a common electrode are formed on and connected to each of the extracting electrode 25b and the surface electrode 28 for the common electrode in the piezoelectric actuator substrate 21, thereby facilitating the connection. On that occasion, by making setting so that each of an area of the surface electrode 28 for the common electrode and an area of the connection electrode for the common electrode is larger than an area of the connection electrode 26, a connection at end portions of the signal transmission section 60 (a front end and an end of the piezoelectric actuator substrate 21 in the longitudinal direction) can be made stronger by the connection on the surface electrode 28 for the common electrode, thereby preventing the signal transmission section 60 from separating from the ends thereof.

The discharge holes 8 are disposed at positions to avoid a region that is opposed to the manifolds 5 disposed on a lower surface side of the flow channel member 4. The discharge holes 8 are further disposed in a region that is opposed to the piezoelectric actuator substrate 21 on the lower surface side of the flow channel member 4. These discharge holes 8 occupy, as a group, a region having approximately the same shape as the piezoelectric actuator substrate 21. Liquid drops are dischargeable from the discharge holes 8 by displacing the displacement elements 30 of the corresponding piezoelectric actuator substrate 21.

The flow channel member 4 included in the head body 2a has a laminate structure having a plurality of plates laminated one upon another. These plates are a cavity plate 4a, a base plate 4b, an aperture plate 4c, a supply plate 4d, manifold plates 4e to 4j, a cover plate 4k, and a nozzle plate 4l in descending order from the upper surface of the flow channel member 4. A large number of holes are formed in these plates. Each of these plates has a thickness of approximately 10-300 µm, thereby enhancing formation accuracy of the holes to be formed. The flow channel member 4 has a thickness of approximately 500 µm to 2 mm. Each of these plates are aligned and laminated so that these holes are communicated to each other and constitute the individual flow channel 12 and the manifold 5. In the head body 2a, components constituting the individual flow channel 12 are disposed close to each other at different positions. Specifically, the pressurizing chamber 10 is disposed on the upper surface of the flow channel member 4, the manifold 5 is disposed on an inside lower surface side, and the discharge hole 8 is disposed on the lower surface, so that the manifold 5 and the discharge hole 8 are connected to each other through the pressurizing chamber 10.

The holes formed in the foregoing plates are described below. These holes can be classified into the following ones. Firstly, there is the pressurizing chamber 10 formed in the cavity plate 4a. Secondly, there is a communication hole constituting the individual supply flow channel 14 connected from one end of the pressurizing chamber 10 to the manifold 5. This communication hole is formed in each of the plates, from the base plate 4b (specifically, an inlet of the pressurizing chamber 10) to the supply plate 4c (specifically, an outlet of the manifold 5). This individual supply flow channel 14 includes the aperture 6 that is a portion formed on the aperture plate 4c and having a small cross-sectional area of the flow channel.

Thirdly, there is a communication hole that constitutes a flow channel being communicated from the other end opposite to the end to which the individual supply flow channel 14 of the pressurizing chamber 10 is connected, to the discharge hole 8. This communication hole is also hereinafter referred to as a descender (partial flow channel) in the following description. The descender is formed in each of the plates, from the base plate 4b (specifically, an outlet of the pressurizing chamber 10) to the nozzle plate 4l (specifically, the discharge hole 8).

Fourthly, there is a communication hole constituting the sub manifold 5a. This communication hole is formed in the manifold plates 4e to 4j. Holes are formed in the manifold plates 4e to 4j so that partition portions serving as the partition walls 15 remain so as to configure the sub manifold 5b. The partition portions in each of the manifold plates 4e to 4j are brought into a state of being connected to each of the manifold plates 4e to 4j via a half-etched support portion (not shown in the drawing).

These communication holes are connected to one another to form the individual flow channel 12 that extends from the inlet for a liquid from the manifold 5 (the outlet of the manifold 5) to the discharge hole 8. The liquid supplied to the manifold 5 is discharged from the discharge hole 8 through the following route. Firstly, the liquid goes upward from the manifold 5 and passes through the individual supply flow channel 14 into one end of the aperture 6. The liquid then goes horizontally along an extending direction of the aperture 6 and reaches the other end of the aperture 6. Subsequently, the liquid goes upward from there and reaches one end of the pressurizing chamber 10. Further, the liquid goes horizontally along an extending direction of the pressurizing chamber 10 and reaches the other end of the pressurizing chamber 10. The liquid that has entered the descender from the pressurizing chamber 10 then mainly goes downward while moving in a horizontal direction. Thus, the liquid reaches the discharge hole 8 being opened into the lower surface, and is then discharged to the outside.

The piezoelectric actuator substrate 21 has a laminate structure containing two piezoelectric ceramic layers 21a and 21b, each being a piezoelectric body. Each of these piezoelectric ceramic layers 21a and 21b has a thickness of approximately 20 µm. A thickness from a lower surface of the piezoelectric ceramic layer 21a to an upper surface of the piezoelectric layer 21b in the piezoelectric actuator substrate 21 is approximately 40 µm. Both the piezoelectric ceramic layers 21a and 21b extend over the pressurizing chambers 10. These piezoelectric ceramic layers 21a and 21b are made of a ceramic material composed mainly of potassium sodium niobate (KNN). The piezoelectric ceramic layer 21a operates as a diaphragm, and does not necessarily need to be the piezoelectric body. Alternatively, other ceramic layer and a metal plate, which are not the piezoelectric body, may be used.

The piezoelectric actuator substrate 21 has the common electrode 24 made of an Ag—Pd based metal material or the like, and the individual electrode 25 made of an Au based metal material or the like. As described above, the individual electrode 25 includes the individual electrode body 25a disposed at the position opposed to the pressurizing chamber 10 on the upper surface of the piezoelectric actuator substrate 21, and the extracting electrode 25b extracted from the individual electrode body 25a. The connection electrode 26 is formed at a portion of one end of the extracting electrode 25b which is extracted beyond a region opposed to the pressurizing chamber 10. The connection electrode 26 is made of, for example, silver-palladium containing glass frit, and is formed in a convex shape with a thickness of approximately 15 µm. The connection electrode 26 is electrically connected to an electrode disposed on the signal transmission section 60. Although the details thereof are described later, a drive signal is to be supplied from the control section 88 to the individual electrode 25 via the signal transmission section 60. The drive signal is supplied on a fixed cycle in synchronization with a transport velocity of the printing medium P.

The common electrode 24 is formed approximately over the entire surface in a planar direction in a region between the piezoelectric ceramic layer 21a and the piezoelectric ceramic layer 21b. That is, the common electrode 24 extends to cover all the pressurizing chambers 10 in a region opposed to the piezoelectric actuator substrate 21. The common electrode 24 has a thickness of approximately 2 µm. The common electrode 24 is connected through the via hole formed in and extending through the piezoelectric ceramic layer 21a to the surface electrode 28 for the common electrode which is formed at the position to avoid the electrode groups of the individual electrodes 25 on the piezoelectric ceramic layer 21a. The common electrode 24 is grounded and held at ground potential. Similarly to a large number of the individual electrodes 25, the surface electrode 28 for the common electrode is directly or indirectly connected to the control section 88.

A portion of the piezoelectric ceramic layer 21a which is sandwiched between the individual electrode 25 and the common electrode 24 is polarized in a thickness direction, and serves as a displacement element 30 having a unimolf structure which is displaced upon application of a voltage to the individual electrode 25. More specifically, when the individual electrode 25 is set at a different potential from that of the common electrode 24 and an electric field is applied to the piezoelectric ceramic layer 21a in a polarization direction thereof, a portion to which the electric field has been applied acts as the active part that is distorted by piezoelectric effect. With this configuration, a portion of the piezoelectric ceramic layer 21a which is sandwiched between the electrodes (an active part) expands and contracts in the planar direction when the control section 88 brings the individual electrode 25 into a predetermined positive or negative potential with respect to the common electrode 24 so that the electric field and the polarization are in the same direction. Meanwhile the piezoelectric ceramic layer 21b that is a non-active layer is not subjected to the influence of the electric field, and therefore does not contract spontaneously but attempts to restrict deformation of the active part. Consequently, a difference of distortion in a planarization direction occurs between the piezoelectric ceramic layer 21a and the piezoelectric ceramic layer 21b. Therefore, the piezoelectric ceramic layer 21b is deformed so as to protrude toward the pressurizing chamber 10 (unimolf deformation).

A liquid discharge operation is described below. The displacement element 30 is driven (displaced) by a drive signal supplied through a driver IC to the individual electrode 25 under the control of the control section 88. Although the liquid is dischargeable by different drive signals in the present embodiment, a so-called pull ejection driving method is described below.

The individual electrode 25 is set to a higher potential than the common electrode 24 (hereinafter referred to as a high potential) in advance. The individual electrode 25 is temporarily set to the same potential as the common electrode 24 (hereinafter referred to as a low potential) every time a discharge request occurs, and is thereafter set again to the high potential at predetermined timing. Thereby, the piezoelectric ceramic layers 21a and 21b (start to) return to their original (flat) shape at the timing that the individual electrode 25 has the low potential, and the volume of the pressurizing chamber 10 is increased compared to an initial state thereof (the state that the potentials of both electrodes are different from each other). Upon this, a negative pressure is applied to the liquid in the pressurizing chamber 10. Subsequently, the liquid in the pressurizing chamber 10 starts to vibrate in an inherent vibration period. Specifically, the volume of the pressurizing chamber 10 firstly starts to increase, and the negative pressure is gradually decreased. Subsequently, the volume of the pressurizing chamber 10 reaches a maximum and the pressure reaches approximately zero. Then, the volume of the pressurizing chamber 10 starts to decrease, and the pressure starts to increase. Thereafter, the individual electrode 25 is set to the high potential at the timing that the pressure reaches an approximately maximum. Upon this, the initially applied vibration and the subsequently applied vibration overlap with each other, and a larger pressure is applied to the liquid. This pressure propagates through the descender and causes the liquid to be discharged from the discharge hole 8.

That is, liquid droplets are dischargeable by supplying the individual electrode 25 with a drive signal of a pulse that keeps the low potential with reference to the high potential for a certain period of time. Provided that this pulse width is an AL (acoustic length) that is half of the time of the inherent vibration period of the liquid in the pressurizing chamber 10, it is in principle possible to maximize the discharge velocity and the amount of discharge of the liquid. The inherent vibration period of the liquid in the pressurizing chamber 10 is considerably influenced by physical properties of the liquid and the shape of the pressurizing chamber 10, and is also influenced by physical properties of the piezoelectric actuator substrate 21 and characteristics of the flow channel connected to the pressurizing chamber 10.

The pulse width is practically set to a value of approximately 0.5-1.5 AL because of other factors to be considered, such as making liquid drops discharged into one. The amount of discharge can be decreased by setting the pulse width to a value beyond the AL. The pulse width is therefore set to the value beyond the AL in order to decrease the amount of discharge.

The piezoelectric actuator substrate 21 and the flow channel member 4 are connected to each other by a thermosetting adhesive. One reason for this is that when discharging various kinds of liquids, such as ink, resistance to the liquids is necessary, and the thermosetting adhesive has higher resistance than cold setting adhesive.

When an extremely large number of drives are repetitively applied to the displacement element 30, the amount of discharge may be decreased. Many factors are involved therein, and one of them is that the piezoelectric ceramic layer 21b in the displacement element 30, except for a range in which the individual electrode 25 and the common electrode 24 are opposed to each other, is a region not directly subjected to piezoelectric driving, however, this region may be gradually deformed upon receipt of stress from a region subjected to the piezoelectric driving. In PZT-based piezoelectric materials, it has been well known to apply in advance a compressive stress in the planar direction of the piezoelectric ceramic layer 21b in order to reduce the deformation. It is possible to establish a state in which the piezoelectric actuator substrate 21 is subjected to a compressive stress in a temperature lowering process by carrying out thermal connection using, as the flow channel member 4, a material having a larger coefficient of thermal expansion than the piezoelectric actuator substrate 21.

As the flow channel member 4, stainless steel is often used because of high corrosion resistance. Examples thereof include Fe—Cr based stainless steels, such as SUS410 (martensite-based stainless steel having a coefficient of thermal expansion of 11.0 ppm/° C.), and SUS430 (ferrite-based stainless steel having a coefficient of thermal expansion of 10.4 ppm/° C.), and Fe—Cr—Ni based stainless steels, such as SUS304 (austenite-based stainless steel having a coefficient of thermal expansion of 17.3 ppm/° C.), and SUS329 (composite austenite-based stainless steel having a coefficient of thermal expansion 12.8 ppm/° C.). All these stainless steels often have a higher coefficient of thermal expansion than the piezoelectric materials. Therefore, the piezoelectric actuator substrate 21 is subjected to a compressive stress after thermal curing.

When potassium sodium niobate is used as the piezoelectric ceramic substrate 21, the piezoelectric ceramic substrate 21 has a coefficient of thermal expansion of approximately 3-5 ppm/° C., and is therefore subjected to a compressive stress. Similarly to the above case, an improvement in driving durability is expectable. It is preferable to bring into a state of being subjected to a compressive stress of 30 MPa or more. Potassium sodium niobate however has a phase transition point between a tetragonal crystal system and an orthorhombic crystal system at a temperature relatively close to room temperature, though there is a difference based on a composition ratio, additives, or the like. The piezoelectric characteristics change with time becomes large when such a temperature change as to cross the phase transition point occurs under the compressive stress in the temperature lowering process in the foregoing adhesion, and a use environment.

In order to reduce the piezoelectric characteristic change, the phase transition point needs to be −20° C. or below by, for example, adjusting the composition. This makes it possible to prevent piezoelectric characteristics change with time from becoming large even under the compressive stress.

In the case of exceeding the phase transition point in the temperature lowering process from the adhesion, a volume change occurs when potassium sodium niobate changes from the tetragonal crystal system to the orthorhombic crystal system. Therefore, residual stress occurs when returned to room temperature. A part of the piezoelectric body is depolarized by the residual stress (compressive stress). Considering a range up to −20° C. as the use temperature, when the phase transition point falls within the range, a crystal structure is to be changed upon receipt of the temperature change that crosses the phase transition point. On that occasion, the piezoelectric body causes a structural change under the compressive stress due to a difference in thermal expansion between the flow channel member 4 and the piezoelectric actuator substrate 21. The piezoelectric body is therefore affected more severely than being subjected to the compressive stress while retaining the same crystal structure. By setting the phase transition point to −20° C. or below, the influence of the foregoing factor is minimized, thereby reducing the piezoelectric characteristic change even under the compressive stress.

Piezoelectric characteristic variations can be reduced when a crystal axis ratio c/a in the tetragonal crystal system is 1.01 or more. The influence of the phase transition point becomes more dominant than the crystal axis ratio c/a when the compressive stress is as large as 80 MPa or more. Under this condition, it is particularly necessary that the phase transition point be −20 or below.

A potassium sodium niobate composition that is so usable is one which is expressed by a composition formula $(K_{1-a}Na_a)NbO_3$ that is pure potassium sodium niobate, or one in which each element is substituted to an element having the same valence up to approximately 20 atomic %. The description that the piezoelectric ceramic layers 21a and 21b are composed mainly of the potassium sodium niobate composition implies that pure potassium sodium niobate or a potassium sodium niobate composition as described below is 80% by mass, preferably 90% by mass, particularly 95% by mass or more.

The potassium sodium niobate composition contains at least Li and Ta besides K, Na, and Nb. The potassium sodium niobate composition preferably contains at least one selected from an element group consisting of Mg, Cu, and Zn, and at least one selected from an element group consisting of Bi, Ca, Ba, and Sr. The potassium sodium niobate composition may further contains Sb.

When a more specific composition of the potassium sodium niobate composition is expressed by a composition formula: $(1-x)\{(K_{1-a}Na_a)_{1-b}Li_b\}_c(Nb_{1-d-e}Ta_dSb_e)O_{2.5+C/2} + xB1_\alpha(A1_{1-\beta}A2_\beta)O_3$, wherein $0.0024 \leq x \leq 0.008$, $0.66 \leq a+3\times b \leq 0.74$, $0.02 \leq b \leq 0.10$, $0.980 \leq c \leq 1.000$, $0.04 \leq d \leq 0.10$, $0 \leq e \leq 0.08$, $2/3 \leq \alpha \leq 1$, and $1/3 \leq \beta \leq 2/3$. Piezoelectric characteristics can be enhanced under conditions that Al is at least one selected from an element group consisting of Mg, Cu, and Zn, A2 is at least one selected from an element group consisting of Nb, Ta, Sb, Ti, Zr, Hf, Ge, Sn, and Ce, and B1 is at least one selected from an element group consisting of Bi, Ca, Ba, and Sr. A1 is particularly preferably Zn because sintering properties is improved and piezoelectric characteristics is also particularly enhanced. A2 is particularly preferably Sn because piezoelectric characteristics is particularly enhanced and insulating properties is also enhanced.

On condition that $0.66 \leq a+3\times b \leq 0.74$, a part of K is to be substituted with Na, and it is therefore possible to increase a piezoelectric constant and make the crystal structure into the tetragonal crystal system. When "b" is 0.02 or more, Li is to be introduced into an A-site, and it is therefore possible to enhance sintering properties of piezoelectric ceramics. By setting "b" to the range of $0.02 \leq b \leq 0.10$, it is possible to enhance piezoelectric characteristics or make the crystal structure into the tetragonal crystal system. "c" is in the range of $0.980 \leq c \leq 1.000$. This is because insulating properties and piezoelectric characteristics may be deteriorated when A-site atoms of perovskite structure exist excessively over 1,000 with respect to B-site atoms, and piezoelectric characteristics is rapidly deteriorated when being less than 0.980.

On condition that $0.04 \leq d \leq 0.10$, a part of Nb is to be substituted with Ta, and it is therefore possible to enhance piezoelectric characteristics. When d exceeds 0.10, piezoelectric characteristics may be deteriorated and Curie temperature may be lowered. The reason why "e" is in the range of $0 \leq e \leq 0.08$ is that sintering properties can be improved by substituting a part of Nb with Sb as required. Sintering properties may be deteriorated when "e" exceeds 0.08.

$B1_\alpha(A1_{1-\beta}A2_\beta)O_3$ in the above composition formula singly has a composite perovskite structure. Because Bi has 6s2 lone electron pairs, large distortion occurs in the crystal structure in the presence of Bi. Ca, Ba, and Sr also have similar effects. By introducing a predetermined amount of these composite oxides into the $\{(K_{1-a}Na_a)_{1-b}Li_b\}_c(Nb_{1-d-e}Ta_dSb_e)O_{2.5+C/2}$ composition, distortion is introduced into the crystal structure of potassium sodium niobate, and consequently polarization is enlarged, thus improving piezoelectric characteristics. This also makes it possible to minimize temperature dependency of piezoelectric characteristics at the same time. Particularly in order to enhance piezoelectric characteristics, B1 is preferably Ba. A compound containing Bi generates a liquid phase at a relatively low temperature, thus leading to the effect that a firing temperature of the piezoelectric ceramics is lowered by introducing a Bi composite oxide.

Here, $\alpha$ is in the range of $2/3 \leq \alpha \leq 1$. By setting $\alpha$ to this range, an oxide of the composite perovskite structure can be incorporated in just proportion into potassium sodium niobate. Piezoelectric characteristics may be deteriorated when $\alpha$ is smaller than $2/3$, and excessive B1 may exist in a grain boundary part when $\alpha$ is larger than 1, thus leading to a risk that piezoelectric characteristics is deteriorated and the insulating properties of the piezoelectric ceramics is deteriorated.

It is assumed that in the perovskite structure of potassium sodium niobate, when a relative amount of Nb is slightly larger, an excessive amount of Nb is arranged at the A-site, and that a further increased amount of Nb is to be arranged between crystal lattices. The Nb that has entered between the crystal lattices acts as a carrier that carries electric charge, and may deteriorate insulating properties. It is therefore preferable to avoid this arrangement. It is possible to prevent the Nb from being arranged between the crystal lattices by allowing alkaline earth metals having a larger ionic radius than Bi, such as Ca, Ba, and Sr, with a part of the perovskite structure. Ions of Bi, Ca, Ba, and Sr do not act as a carrier that carries electric charge, and these ions are less apt to deteriorate insulating properties.

A comparison is made between Bi as B1 and the alkaline earth metals. Bi is preferred because a firing temperature is lowered. The alkaline earth elements are preferred to Bi in the point that the piezoelectric constant is further increased than that in the case of Bi.

A comparison is made between the case of having a high ratio of the alkaline earth elements and the case of having a high ratio of Bi. The case of having the high ratio of the alkaline earth elements is preferred as follows. The phase transition point is relatively lowered. Therefore, under the condition that the phase transition point is −20° C. or below, a range that permits adjustment of a ratio of other composition is widened, thereby increasing the degree of freedom. In order to decrease the phase transition point, a total amount of the alkaline earth elements is preferably 75% or more of the entirety of B1 when the ratio of the alkaline earth elements is high. When the ratio of Bi is high, B1 is preferably composed of approximately only Bi. When the piezoelectric ceramics is simultaneously fired together with the conductor, Bi is highly reactive and therefore reacts with, for example, silver. This may increase the percentage of occurrence of piezoelectric ceramics having a poor appearance. The alkaline earth elements are preferred because they are less apt to cause this situation.

A1 is at least one selected from the element group consisting of Mg, Cu, and Zn. A2 is at least one selected from the element group consisting of Nb, Ta, Sb, Ti, Zr, Hf, Ge, Sn, and Ce. These have approximately the same ionic radius as Nb in a 6-coordinate state with oxygen.

$\beta$ is in the range of $1/3 \leq \beta \leq 2/3$. By setting $\beta$ to this range, it is possible to bring a ratio of A1 and A2 into a range of stoichiometric mixture ratio. When the ratio of A1 and A2 is remarkably beyond the stoichiometric mixture ratio, oxygen vacancy may be formed, and the piezoelectric characteristics may be deteriorated.

When A2 is an element that becomes a pentavalent ion, namely, at least one kind of element selected from among Nb, Ta, and Sb, A1 and A2 can be brought into the range of the stoichiometric mixture ratio by setting $\alpha+\beta$ to 4/3. This is preferable. When A2 is an element that becomes a tetravalent ion, namely, at least one kind of element selected from among Ti, Zr, Hf, Ge, Sn, and Ce, A1 and A2 can be brought into the range of the stoichiometric mixture ratio by setting $\beta$ to ½. This is preferable. A total number of valencies of $B1_\alpha(A1_{1-\beta}A2_\beta)O_3$ may not be zero depending on the values of coefficients. As a composition of an actual piezoelectric body, however, the total of the valencies retains zero by the fact that the value of 3 in the "$O_3$" portion deviates from 3.

The piezoelectric ceramic layers 21a and 21b may contain additive ingredients, such as sintering additives, other than the potassium sodium niobate composition, namely, pure potassium sodium niobate, one whose partial element has been substituted, and one which contains the foregoing perovskite ingredient. For example, as the sintering additives, 0.1-0.5 parts by mass of Mn in terms of $MnO_2$, or 0.2-1.0 parts by mass of Cr in terms of $Cr_2O_3$ may be added relative to 100 parts by mass of the potassium sodium niobate composition.

The foregoing liquid discharge head 2 is manufactured, for example, in the following manner. That is, with a tape forming method, such as a roll coater method or slit coater method, a tape composed of KNN-based piezoelectric ceramic raw material powder and an organic composition is formed to produce a plurality of green sheets that are respectively fired into the piezoelectric ceramic layers 21a and 21b. An Ag—Pd paste serving as the common electrode 24 is formed on a surface of each of these green sheets by a printing method or the like. A via hole that connects the common electrode 24 and the surface electrode 28 for the common electrode is formed in a part of these green sheets as required.

Subsequently, these green sheets are laminated one upon another to produce a laminated body, followed by adhesion under pressure. The laminated body subjected to the adhesion under pressure is then fired in a high oxygen concentration atmosphere, thereby obtaining a fired body. Thereafter, the individual electrodes 25 are printed and fired on a surface of the fired body by using an organic golden paste. Further, the connection electrodes 26 and the surface electrode 28 for the common electrode are printed and fired by using an Ag paste. The Ag paste enters the via hole that is opened into the green sheets during the printing, and is connected to the common electrode 24. After the firing, the surface electrode 28 for the common electrode and the common electrode 24 are electrically connected to each other.

Subsequently, holes, which respectively become the manifold 5, the individual supply flow channel 14, the pressurizing chamber 10, and the descender, are processed into their respective predetermined shapes by etching in the plates 4a to 4l produced by laminating these plates with the adhesive layer interposed therebetween. These plates 4a to 4l are preferably formed by at least one kind of metal selected from the group consisting of Fe—Cr base, Fe—Ni base, and WC-Tic base. Particularly, when ink is used as a liquid, these plates are preferably made of a material having excellent corrosion resistance to the ink. Therefore, Fe—Cr base is more preferable.

The piezoelectric actuator substrate 21 and the flow channel member 4 are laminated and adhered, for example, with a thermosetting adhesive layer interposed therebetween. As the adhesive layer, a well-known one is usable. However, in order to eliminate the influence on the piezoelectric actuator substrate 21 and the flow channel member 4, it is preferable to use at least one kind of adhesive selected from the group consisting of an epoxy resin, phenol resin, and polyphenylene ether resin, each having a thermal curing temperature of 100-150° C. The piezoelectric actuator substrate 21 and the flow channel member 4 are thermally connected by heating to the thermal curing temperature by using the adhesive layer.

Thereafter, a voltage is applied to between the individual electrode 25 and the common electrode 24, and the piezoelectric ceramic layer 21b that is a portion held therebetween is polarized, thereby obtaining the liquid discharge head 2.

Although the foregoing description has been made using the liquid discharge head 2, the same is true with other piezoelectric elements. That is, when a piezoelectric body of a piezoelectric element extend in a planar direction and a compressive stress is applied in the planar direction, the variations of piezoelectric characteristics can be minimized as long as the piezoelectric body is potassium sodium niobate, and the phase transition point between the tetragonal crystal system and the orthorhombic crystal system is −20° C. or below. The piezoelectric element is usable to configure, actuators used for other than the liquid discharge head, such as speakers, buzzers, sensors, and filters that configure electric circuits.

In the speakers and buzzers, for example, a high thermal expansion member, such as metal, is used as a diaphragm serving as a surface that generates sound, and the piezoelectric element and the diaphragm are thermally connected to each other, thereby obtaining a piezoelectric member whose piezoelectric body is subjected to a compressive stress. In the sensors and filters, for example, a high thermal expansion member, such as metal, is used as a support body that mechanically holds the piezoelectric body, and the piezoelectric element and the support body are thermally connected to each other, thus obtaining a piezoelectric member whose piezoelectric body is subjected to a compressive stress.

EXAMPLES

A piezoelectric actuator substrate 21 for evaluation was manufactured and evaluated. As piezoelectric materials used for the piezoelectric ceramic layers 21a and 21b, powders of $K_2CO_3$, $Na_2CO_3$, $Li_2CO_3$, $Nb_2O_5$, $Ta_2O_5$, $Sb_2O_3$, $Bi_2O_3$, $MgCo_3$, $CaCO_3$, $SrCO_3$, $BaCO_3$, CuO, $TiO_2$, $ZrO_2$, $HfO_2$, $GeO_2$, $SnO_2$, and $CeO_2$ were prepared so that parameters in the composition formula: $(1-x)\{(K_{1-a}Na_a)_{1-b}Li_b\}_c(Nb_{1-d-e}Ta_dSb_e)O_{2.5+c/2}+xB1_\alpha(Al_{1-\beta}A2_\beta)O_3$ have values in Table 1. Further, as sintering additives, powder of $MnO_2$ or $Cr_2O_3$ was added in parts by mass as presented in Tables 1 to 3, relative to 100 parts by mass of the above composition formula, thereby obtaining a raw material.

The prepared raw material together with water or isopropanol and zirconia balls were put in a pot and mixed together. The mixed raw material was temporarily dried and then calcinated at 900° C. The calcinated raw material together with water or isopropanol and zirconia balls were put in the pot and crushed. A slurry was prepared using this powder. Green sheets were manufactured from the slurry by employing the roll coater method as a forming method.

Subsequently, an electrode pattern serving as the common electrode 34 was formed on a surface of the green sheet by a screen printing method using a conductor paste containing Ag—Pd alloy. Then, the green sheet not subjected to the printing was laminated on the above-mentioned green sheet, followed by firing at a temperature of 1050° C. After the firing, the individual electrodes 25 were printed with an Ag-paste, followed by firing, thus manufacturing the piezoelectric actuator substrate 21.

The manufactured piezoelectric actuator substrate 21 was as shown in FIGS. 2 to 5. Two piezoelectric actuator substrates 21 were prepared for each sample, one of which was evaluated without being connected to the support body (flow channel member 4), and the other was evaluated after being thermally connected to the support body. SUS430 was used as the support body. The thermal connection was carried out at 120° C. by applying epoxy resin to between the support body and the piezoelectric actuator substrate 21. Tables 1 to 3 present values of piezoelectric constant d31 of the piezoelectric actuator substrate 21 not being connected to the support body, and temperatures of phase transition points between the orthorhombic crystal system and the tetragonal crystal system. The orthorhombic crystal system and the tetragonal crystal system observed here were ones which had a crystal structure of a potassium sodium niobate composition and were slightly shifted from pure potassium sodium niobate according to x-ray diffraction.

Figure 6:
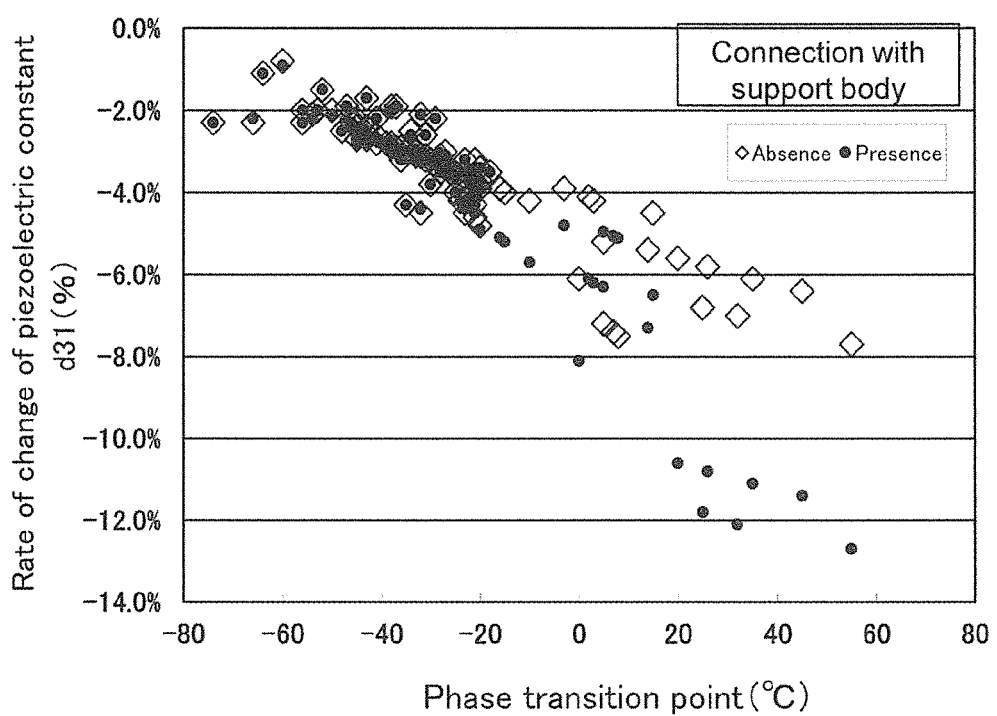
FIG. 6 is a graph showing a relationship between a phase transition point and a change rate of d31 after a temperature cycle test.

The piezoelectric actuator substrate 21 being connected to the support body and the piezoelectric actuator substrate 21 not being connected to the support body were subjected to a temperature cycle test. After carrying out 10 cycles of the temperature cycle test of 80° C. (for 30 minutes) to −20° C. (for 30 minutes), the piezoelectric constant d31 was measured. Tables 1 to 3 present change rates between before and after the test. Tables 1 to 3 also present the presence or absence of connection, that is, a difference in change rate depending on whether the piezoelectric body is subjected to a compressive stress. FIG. 6 is a graph showing a relationship between a phase transition point and a decrease rate of the piezoelectric constant d31 obtained in the temperature cycle test by distinguishing between the presence and absence of the connection.

TABLE 1

| Sample No. | Formulation Composition | | | | | | B1 | | | | | | | |
|---|---|---|---|---|---|---|---|---|---|---|---|---|---|---|
| | x | a | b | c | d | e | Bi | Ba | Sr | Ca | A1 | A2 | α | β |
| 1 | 0.0025 | 0.690 | 0.020 | 1.000 | 0.10 | 0.06 | 1.00 | — | — | — | Zn | Sn | 1 | 1/2 |
| 2 | 0.0025 | 0.680 | 0.020 | 1.000 | 0.10 | 0.06 | 1.00 | — | — | — | Zn | Sn | 1 | 1/2 |
| 3 | 0.0025 | 0.650 | 0.020 | 1.000 | 0.10 | 0.06 | 1.00 | — | — | — | Zn | Sn | 1 | 1/2 |
| *4 | 0.0025 | 0.640 | 0.020 | 1.000 | 0.10 | 0.06 | 1.00 | — | — | — | Zn | Sn | 1 | 1/2 |
| *5 | 0.0025 | 0.630 | 0.020 | 1.000 | 0.10 | 0.06 | 1.00 | — | — | — | Zn | Sn | 1 | 1/2 |
| 6 | 0.0025 | 0.630 | 0.040 | 1.000 | 0.10 | 0.06 | 1.00 | — | — | — | Zn | Sn | 1 | 1/2 |
| 7 | 0.0025 | 0.620 | 0.040 | 1.000 | 0.10 | 0.06 | 1.00 | — | — | — | Zn | Sn | 1 | 1/2 |
| *8 | 0.0025 | 0.600 | 0.040 | 1.000 | 0.10 | 0.06 | 1.00 | — | — | — | Zn | Sn | 1 | 1/2 |
| *9 | 0.0025 | 0.580 | 0.040 | 1.000 | 0.10 | 0.06 | 1.00 | — | — | — | Zn | Sn | 1 | 1/2 |
| *10 | 0.0025 | 0.570 | 0.040 | 1.000 | 0.10 | 0.06 | 1.00 | — | — | — | Zn | Sn | 1 | 1/2 |
| 11 | 0.0025 | 0.580 | 0.060 | 1.000 | 0.10 | 0.06 | 1.00 | — | — | — | Zn | Sn | 1 | 1/2 |
| 12 | 0.0025 | 0.570 | 0.060 | 1.000 | 0.10 | 0.06 | 1.00 | — | — | — | Zn | Sn | 1 | 1/2 |
| 13 | 0.0025 | 0.550 | 0.060 | 1.000 | 0.10 | 0.06 | 1.00 | — | — | — | Zn | Sn | 1 | 1/2 |
| 14 | 0.0025 | 0.540 | 0.060 | 1.000 | 0.10 | 0.06 | 1.00 | — | — | — | Zn | Sn | 1 | 1/2 |
| *15 | 0.0025 | 0.520 | 0.060 | 1.000 | 0.10 | 0.06 | 1.00 | — | — | — | Zn | Sn | 1 | 1/2 |
| *16 | 0.0025 | 0.510 | 0.060 | 1.000 | 0.10 | 0.06 | 1.00 | — | — | — | Zn | Sn | 1 | 1/2 |
| 17 | 0.0025 | 0.520 | 0.080 | 1.000 | 0.10 | 0.06 | 1.00 | — | — | — | Zn | Sn | 1 | 1/2 |
| 18 | 0.0025 | 0.510 | 0.080 | 1.000 | 0.10 | 0.06 | 1.00 | — | — | — | Zn | Sn | 1 | 1/2 |
| 19 | 0.0025 | 0.490 | 0.080 | 1.000 | 0.10 | 0.06 | 1.00 | — | — | — | Zn | Sn | 1 | 1/2 |
| *20 | 0.0025 | 0.470 | 0.080 | 1.000 | 0.10 | 0.06 | 1.00 | — | — | — | Zn | Sn | 1 | 1/2 |
| *21 | 0.0025 | 0.460 | 0.080 | 1.000 | 0.10 | 0.06 | 1.00 | — | — | — | Zn | Sn | 1 | 1/2 |
| 22 | 0.0025 | 0.470 | 0.100 | 1.000 | 0.10 | 0.06 | 1.00 | — | — | — | Zn | Sn | 1 | 1/2 |
| 23 | 0.0025 | 0.460 | 0.100 | 1.000 | 0.10 | 0.06 | 1.00 | — | — | — | Zn | Sn | 1 | 1/2 |
| *24 | 0.0025 | 0.440 | 0.100 | 1.000 | 0.10 | 0.06 | 1.00 | — | — | — | Zn | Sn | 1 | 1/2 |
| *25 | 0.0025 | 0.430 | 0.100 | 1.000 | 0.10 | 0.06 | 1.00 | — | — | — | Zn | Sn | 1 | 1/2 |
| *26 | 0.0025 | 0.560 | 0.050 | 1.010 | 0.10 | 0.06 | 1.00 | — | — | — | Zn | Sn | 1 | 1/2 |
| *27 | 0.0025 | 0.560 | 0.050 | 1.005 | 0.10 | 0.06 | 1.00 | — | — | — | Zn | Sn | 1 | 1/2 |

TABLE 1-continued

| Sample No. | x | a | b | c | d | e | B1 Bi | Ba | Sr | Ca | A1 | A2 | α | β |
|---|---|---|---|---|---|---|---|---|---|---|---|---|---|---|
| 28 | 0.0025 | 0.560 | 0.050 | 0.995 | 0.10 | 0.06 | 1.00 | — | — | — | Zn | Sn | 1 | 1/2 |
| 29 | 0.0025 | 0.520 | 0.050 | 0.990 | 0.04 | 0.06 | 1.00 | — | — | — | Zn | Sn | 1 | 1/2 |
| 30 | 0.0025 | 0.540 | 0.050 | 0.980 | 0.06 | 0.06 | 1.00 | — | — | — | Zn | Sn | 1 | 1/2 |
| 31 | 0.0025 | 0.560 | 0.050 | 0.970 | 0.10 | 0.06 | 1.00 | — | — | — | Zn | Sn | 1 | 1/2 |
| 32 | 0.0010 | 0.560 | 0.050 | 0.990 | 0.10 | 0.06 | 1.00 | — | — | — | Zn | Sn | 1 | 1/2 |
| 33 | 0.0035 | 0.560 | 0.050 | 0.990 | 0.10 | 0.06 | 1.00 | — | — | — | Zn | Sn | 1 | 1/2 |
| 34 | 0.0050 | 0.560 | 0.050 | 0.990 | 0.10 | 0.06 | 1.00 | — | — | — | Zn | Sn | 1 | 1/2 |
| 35 | 0.0080 | 0.560 | 0.050 | 0.990 | 0.10 | 0.06 | 1.00 | — | — | — | Zn | Sn | 1 | 1/2 |
| *36 | 0.0100 | 0.560 | 0.050 | 0.990 | 0.10 | 0.06 | 1.00 | — | — | — | Zn | Sn | 1 | 1/2 |
| *37 | 0.0150 | 0.560 | 0.050 | 0.990 | 0.10 | 0.06 | 1.00 | — | — | — | Zn | Sn | 1 | 1/2 |
| 38 | 0.0025 | 0.520 | 0.050 | 0.990 | 0.04 | 0.06 | 1.00 | — | — | — | Zn | Sn | 1 | 1/2 |
| 39 | 0.0025 | 0.540 | 0.050 | 0.990 | 0.06 | 0.06 | 1.00 | — | — | — | Zn | Sn | 1 | 1/2 |
| 40 | 0.0025 | 0.560 | 0.050 | 0.990 | 0.10 | 0.06 | 1.00 | — | — | — | Zn | Sn | 1 | 1/2 |

| Sample No. | Formulation Composition | | $d_{31}$ [pm/V] | Phase transition point [° C.] | Rate of change of $d_{31}$ after temperature cycle Connection with support body | | |
|---|---|---|---|---|---|---|---|
| | $MnO_2$ [Parts by mass] | $Cr_2O_3$ [Parts by mass] | | | Absence | Presence | Difference |
| 1 | 0.25 | — | 69 | −74 | −2.3% | −2.3% | 0.0% |
| 2 | 0.25 | — | 90 | −45 | −2.7% | −2.8% | −0.1% |
| 3 | 0.25 | — | 101 | −28 | −3.2% | −3.2% | 0.0% |
| *4 | 0.25 | — | 109 | 3 | −4.2% | −6.2% | −2.0% |
| *5 | 0.25 | — | 95 | 15 | −4.5% | −6.5% | −2.0% |
| 6 | 0.25 | — | 76 | −37 | −1.9% | −1.9% | 0.0% |
| 7 | 0.25 | — | 92 | −29 | −2.2% | −2.2% | 0.0% |
| *8 | 0.25 | — | 98 | −18 | −3.5% | −3.5% | 0.0% |
| *9 | 0.25 | — | 105 | 20 | −5.6% | −10.6% | −5.0% |
| *10 | 0.25 | — | 93 | 45 | −6.4% | −11.4% | −5.0% |
| 11 | 0.25 | — | 65 | −64 | −1.1% | −1.1% | 0.0% |
| 12 | 0.25 | — | 74 | −38 | −2.9% | −2.9% | 0.0% |
| 13 | 0.25 | — | 92 | −25 | −3.6% | −3.6% | 0.0% |
| 14 | 0.25 | — | 97 | −20 | −3.4% | −3.4% | 0.0% |
| *15 | 0.25 | — | 115 | 2 | −4.1% | −6.1% | −2.0% |
| *16 | 0.25 | — | 99 | 35 | −6.1% | −11.1% | −5.0% |
| 17 | 0.25 | — | 71 | −56 | −2.3% | −2.3% | 0.0% |
| 18 | 0.25 | — | 83 | −33 | −3.0% | −3.0% | 0.0% |
| 19 | 0.25 | — | 96 | −28 | −3.2% | −3.2% | 0.0% |
| *20 | 0.25 | — | 101 | 14 | −5.4% | −7.3% | −1.9% |
| *21 | 0.25 | — | 95 | 25 | −6.8% | −11.8% | −5.0% |
| 22 | 0.25 | — | 71 | −45 | −2.7% | −2.7% | 0.0% |
| 23 | 0.25 | — | 80 | −31 | −3.1% | −3.1% | 0.0% |
| *24 | 0.25 | — | 94 | −3 | −3.9% | −4.8% | −0.9% |
| *25 | 0.25 | — | 103 | 26 | −5.8% | −10.8% | −5.0% |
| *26 | 0.25 | — | 81 | 55 | −7.7% | −12.7% | −5.0% |
| *27 | 0.25 | — | 99 | 32 | −7.0% | −12.1% | −5.1% |
| 28 | 0.25 | — | 112 | −20 | −3.4% | −3.4% | 0.0% |
| 29 | 0.25 | — | 103 | −41 | −2.8% | −2.7% | 0.1% |
| 30 | 0.25 | — | 100 | −45 | −2.7% | −2.6% | 0.1% |
| 31 | 0.25 | — | 86 | −58 | −2.0% | −2.0% | 0.0% |
| 32 | 0.25 | — | 71 | −47 | −1.9% | −1.9% | 0.0% |
| 33 | 0.25 | — | 100 | −36 | −3.2% | −3.2% | 0.0% |
| 34 | 0.25 | — | 105 | −28 | −3.5% | −3.5% | 0.0% |
| 35 | 0.25 | — | 98 | −21 | −4.3% | −4.3% | 0.0% |
| *36 | 0.25 | — | 93 | 5 | −5.2% | −6.3% | −1.1% |
| *37 | 0.25 | — | 73 | 25 | −6.8% | −11.8% | −5.0% |
| 38 | 0.25 | — | 92 | −32 | −2.1% | −2.1% | 0.0% |
| 39 | 0.25 | — | 97 | −38 | −1.9% | −2.0% | −0.1% |
| 40 | 0.25 | — | 80 | −37 | −2.9% | −3.0% | −0.1% |

The Samples indicated with * are out of the range of the present invention.

TABLE 2

| Sample No. | Formulation Composition | | | | | | | | | | | | | |
|---|---|---|---|---|---|---|---|---|---|---|---|---|---|---|
| | x | a | b | c | d | e | B1 Bi | Ba | Sr | Ca | A1 | A2 | α | β |
| 41 | 0.0025 | 0.560 | 0.050 | 0.990 | 0.10 | — | 1.00 | — | — | — | Zn | Sn | 1 | 1/2 |
| 42 | 0.0025 | 0.560 | 0.050 | 0.990 | 0.10 | 0.04 | 1.00 | — | — | — | Zn | Sn | 1 | 1/2 |
| 43 | 0.0025 | 0.560 | 0.050 | 0.990 | 0.10 | 0.08 | 1.00 | — | — | — | Zn | Sn | 1 | 1/2 |
| *44 | 0.0025 | 0.560 | 0.050 | 0.990 | 0.10 | 0.12 | 1.00 | — | — | — | Zn | Sn | 1 | 1/2 |
| 45 | 0.0025 | 0.560 | 0.050 | 0.990 | 0.10 | 0.06 | 1.00 | — | — | — | Zn | Sn | 1 | 1/2 |

TABLE 2-continued

| Sample No. | | | | | | | | | | | | | | |
|---|---|---|---|---|---|---|---|---|---|---|---|---|---|---|
| 46 | 0.0025 | 0.560 | 0.050 | 0.990 | 0.10 | 0.06 | 1.00 | — | — | — | Zn | Sn | 1 | 1/2 |
| 47 | 0.0025 | 0.560 | 0.050 | 0.990 | 0.10 | 0.06 | 1.00 | — | — | — | Zn | Sn | 1 | 1/2 |
| 48 | 0.0025 | 0.560 | 0.050 | 0.990 | 0.10 | 0.06 | 1.00 | — | — | — | Zn | Sn | 1 | 1/2 |
| 49 | 0.0025 | 0.560 | 0.050 | 0.990 | 0.10 | 0.06 | 1.00 | — | — | — | Zn | Sn | 1 | 1/2 |
| 50 | 0.0025 | 0.560 | 0.050 | 0.990 | 0.10 | 0.06 | 1.00 | — | — | — | Zn | Sn | 1 | 1/2 |
| 51 | 0.0025 | 0.560 | 0.050 | 0.990 | 0.10 | 0.06 | 1.00 | — | — | — | Zn | Sn | 2/3 | 1/2 |
| 52 | 0.0025 | 0.520 | 0.050 | 0.990 | 0.04 | 0.06 | 1.00 | — | — | — | Mg | Nb | 1 | 1/3 |
| 53 | 0.0025 | 0.520 | 0.050 | 0.990 | 0.04 | 0.06 | 1.00 | — | — | — | Mg | Ti | 1 | 1/2 |
| 54 | 0.0025 | 0.520 | 0.050 | 0.990 | 0.04 | 0.06 | 1.00 | — | — | — | Mg | Sn | 1 | 1/2 |
| 55 | 0.0025 | 0.520 | 0.050 | 0.990 | 0.04 | 0.06 | 1.00 | — | — | — | Zn | Nb | 1 | 1/3 |
| 56 | 0.0025 | 0.520 | 0.050 | 0.990 | 0.04 | 0.06 | 1.00 | — | — | — | Zn | Sb | 1 | 1/3 |
| 57 | 0.0025 | 0.520 | 0.050 | 0.990 | 0.04 | 0.06 | 1.00 | — | — | — | Zn | Ti | 1 | 1/2 |
| 58 | 0.0025 | 0.520 | 0.050 | 0.990 | 0.04 | 0.06 | 1.00 | — | — | — | Zn | Sn | 1 | 1/2 |
| 59 | 0.0025 | 0.520 | 0.050 | 0.990 | 0.04 | 0.06 | 1.00 | — | — | — | Zn | Zr | 1 | 1/2 |
| 60 | 0.0025 | 0.520 | 0.050 | 0.990 | 0.04 | 0.06 | 1.00 | — | — | — | Zn | Hf | 1 | 1/2 |
| 61 | 0.0025 | 0.520 | 0.050 | 0.990 | 0.04 | 0.06 | 1.00 | — | — | — | Zn | Ce | 1 | 1/2 |
| 62 | 0.0025 | 0.520 | 0.050 | 0.990 | 0.04 | 0.06 | 1.00 | — | — | — | Zn | Ge | 1 | 1/2 |
| 63 | 0.0025 | 0.520 | 0.050 | 0.990 | 0.04 | 0.06 | 1.00 | — | — | — | Cu | Nb | 1 | 1/2 |
| 64 | 0.0025 | 0.520 | 0.050 | 0.990 | 0.04 | 0.06 | 1.00 | — | — | — | Cu | Ta | 1 | 1/2 |
| 65 | 0.0025 | 0.520 | 0.050 | 0.990 | 0.04 | 0.06 | 1.00 | — | — | — | Cu | Sb | 1 | 1/2 |
| 66 | 0.0025 | 0.520 | 0.050 | 0.990 | 0.04 | 0.06 | 1.00 | — | — | — | Cu | Sn | 1 | 1/2 |
| 67 | 0.0025 | 0.520 | 0.050 | 0.990 | 0.04 | 0.06 | 1.00 | — | — | — | Cu | Ti | 1 | 1/2 |
| 68 | — | 0.560 | 0.050 | 0.990 | 0.10 | 0.06 | — | — | — | — | — | — | — | — |
| 69 | 0.0025 | 0.560 | 0.050 | 0.990 | 0.10 | 0.06 | 1.00 | — | — | — | Zn | Sn | 1 | 1/2 |
| 70 | 0.0008 | 0.560 | 0.050 | 0.990 | 0.10 | 0.06 | 1.00 | — | — | — | Zn | Sn | 1 | 1/2 |
| 71 | 0.0024 | 0.560 | 0.050 | 0.990 | 0.10 | 0.06 | 1.00 | — | — | — | Zn | Sn | 1 | 1/2 |
| 72 | 0.0025 | 0.560 | 0.050 | 0.990 | 0.10 | 0.06 | — | — | 1.00 | — | Zn | Sn | 1 | 1/2 |
| 73 | 0.0025 | 0.565 | 0.040 | 0.990 | 0.10 | 0.06 | — | 1.00 | — | — | Zn | Sn | 1 | 1/2 |
| 74 | 0.0025 | 0.565 | 0.040 | 0.990 | 0.10 | 0.06 | — | — | 1.00 | — | Zn | Sn | 1 | 1/2 |
| 75 | 0.0025 | 0.565 | 0.040 | 0.990 | 0.10 | 0.06 | — | — | — | 1.00 | Zn | Sn | 1 | 1/2 |
| 76 | 0.0025 | 0.565 | 0.040 | 0.990 | 0.10 | 0.06 | 0.25 | 0.75 | — | — | Zn | Sn | 1 | 1/2 |
| 77 | 0.0025 | 0.565 | 0.040 | 0.990 | 0.10 | 0.06 | 0.25 | — | 0.75 | — | Zn | Sn | 1 | 1/2 |
| 78 | 0.0025 | 0.565 | 0.040 | 0.990 | 0.10 | 0.06 | 0.25 | — | — | 0.75 | Zn | Sn | 1 | 1/2 |
| *79 | 0.0025 | 0.565 | 0.040 | 0.990 | 0.10 | 0.06 | 0.50 | 0.50 | — | — | Zn | Sn | 1 | 1/2 |
| *80 | 0.0025 | 0.565 | 0.040 | 0.990 | 0.10 | 0.06 | 0.50 | — | 0.50 | — | Zn | Sn | 1 | 1/2 |
| *81 | 0.0025 | 0.565 | 0.040 | 0.990 | 0.10 | 0.06 | 0.50 | — | — | 0.50 | Zn | Sn | 1 | 1/2 |
| 82 | 0.0025 | 0.565 | 0.040 | 0.990 | 0.10 | 0.06 | 0.25 | 0.25 | 0.25 | 0.25 | Zn | Sn | 1 | 1/2 |

| | Formulation Composition | | | Phase | Rate of change of $d_{31}$ after temperature cycle Connection with support body | | |
|---|---|---|---|---|---|---|---|
| Sample No. | $MnO_2$ [Parts by mass] | $Cr_2O_3$ [Parts by mass] | $d_{31}$ [pm/V] | transition point [°C.] | Absence | Presence | Difference |
| 41 | 0.25 | — | 89 | −35 | −3.0% | −3.0% | 0.0% |
| 42 | 0.25 | — | 94 | −34 | −2.5% | −2.6% | −0.1% |
| 43 | 0.25 | — | 101 | −31 | −2.6% | −2.6% | 0.0% |
| *44 | 0.25 | — | 100 | 0 | −6.1% | −8.1% | −2.0% |
| 45 | — | — | 123 | −32 | −4.5% | −4.4% | 0.1% |
| 46 | 0.10 | — | 114 | −35 | −4.3% | −4.3% | 0.0% |
| 47 | 0.50 | — | 91 | −52 | −1.5% | −1.5% | 0.0% |
| 48 | — | 0.20 | 115 | −33 | −3.0% | −3.1% | −0.1% |
| 49 | — | 0.50 | 94 | −43 | −2.7% | −2.8% | −0.1% |
| 50 | — | 1.00 | 91 | −48 | −2.5% | −2.5% | 0.0% |
| 51 | 0.25 | — | 101 | −43 | −1.7% | −1.7% | 0.0% |
| 52 | 0.25 | — | 98 | −46 | −2.3% | −2.3% | 0.0% |
| 53 | 0.25 | — | 95 | −53 | −2.0% | −2.0% | 0.0% |
| 54 | 0.25 | — | 99 | −41 | −2.2% | −2.2% | 0.0% |
| 55 | 0.25 | — | 105 | −28 | −3.1% | −3.1% | 0.0% |
| 56 | 0.25 | — | 102 | −30 | −3.8% | −3.8% | 0.0% |
| 57 | 0.25 | — | 100 | −22 | −4.1% | −4.1% | 0.0% |
| 58 | 0.25 | — | 108 | −24 | −4.2% | −4.2% | 0.0% |
| 59 | 0.25 | — | 110 | −22 | −3.6% | −3.7% | −0.1% |
| 60 | 0.25 | — | 111 | −23 | −3.5% | −3.5% | 0.0% |
| 61 | 0.25 | — | 107 | −26 | −3.5% | −3.5% | 0.0% |
| 62 | 0.25 | — | 107 | −25 | −4.0% | −4.0% | 0.0% |
| 63 | 0.25 | — | 113 | −21 | −3.9% | −3.9% | 0.0% |
| 64 | 0.25 | — | 112 | −22 | −3.6% | −3.6% | 0.0% |
| 65 | 0.25 | — | 110 | −23 | −3.2% | −3.2% | 0.0% |
| 66 | 0.25 | — | 118 | −20 | −3.9% | −3.9% | 0.0% |
| 67 | 0.25 | — | 115 | −21 | −3.7% | −3.7% | 0.0% |
| 68 | 0.25 | — | 45 | −83 | −2.1% | −2.2% | −0.1% |
| 69 | 0.25 | — | 61 | −86 | −2.3% | −2.2% | 0.1% |
| 70 | 0.25 | — | 68 | −54 | −2.1% | −2.2% | −0.1% |
| 71 | 0.25 | — | 90 | −38 | −2.8% | −2.8% | 0.0% |
| 72 | 0.25 | — | 92 | −60 | −0.8% | −0.9% | −0.1% |
| 73 | 0.25 | — | 116 | −43 | −2.4% | −2.5% | −0.1% |
| 74 | 0.25 | — | 108 | −41 | −2.6% | −2.7% | −0.1% |

TABLE 2-continued

| | | | | | | | |
|---|---|---|---|---|---|---|---|
| 75 | 0.25 | — | 115 | −45 | −2.2% | −2.4% | −0.2% |
| 76 | 0.25 | — | 110 | −21 | −4.6% | −4.5% | 0.1% |
| 77 | 0.25 | — | 104 | −20 | −4.8% | −4.9% | −0.1% |
| 78 | 0.25 | — | 110 | −23 | −4.5% | −4.4% | 0.1% |
| *79 | 0.25 | — | 105 | 5 | −7.2% | −5.0% | 2.2% |
| *80 | 0.25 | — | 101 | 8 | −7.5% | −5.1% | 2.4% |
| *81 | 0.25 | — | 104 | 7 | −7.4% | −5.1% | 2.3% |
| 82 | 0.25 | — | 108 | −21 | −4.6% | −4.5% | 0.1% |

The Samples indicated with * are out of the range of the present invention.

TABLE 3

| Sample No. | Formulation Composition | | | | | | | | | | | | | |
|---|---|---|---|---|---|---|---|---|---|---|---|---|---|---|
| | x | a | b | c | d | e | B1 Bi | Ba | Sr | Ca | A1 | A2 | α | β |
| 83 | 0.0025 | 0.565 | 0.040 | 0.995 | 0.10 | 0.06 | 1.00 | — | — | — | Zn | Sn | 1 | 1/2 |
| 84 | 0.0025 | 0.565 | 0.040 | 0.995 | 0.10 | 0.06 | — | 1.00 | — | — | Zn | Sn | 1 | 1/2 |
| 85 | 0.0025 | 0.565 | 0.040 | 0.995 | 0.10 | 0.06 | — | — | 1.00 | — | Zn | Sn | 1 | 1/2 |
| 86 | 0.0025 | 0.565 | 0.040 | 0.995 | 0.10 | 0.06 | — | — | — | 1.00 | Zn | Sn | 1 | 1/2 |
| 87 | 0.0025 | 0.565 | 0.040 | 0.995 | 0.10 | 0.06 | 0.25 | 0.75 | — | — | Zn | Sn | 1 | 1/2 |
| 88 | 0.0025 | 0.565 | 0.040 | 0.995 | 0.10 | 0.06 | 0.25 | — | 0.75 | — | Zn | Sn | 1 | 1/2 |
| 89 | 0.0025 | 0.565 | 0.040 | 0.995 | 0.10 | 0.06 | 0.25 | — | — | 0.75 | Zn | Sn | 1 | 1/2 |
| 90 | 0.0025 | 0.565 | 0.040 | 0.995 | 0.10 | 0.06 | 0.50 | 0.50 | — | — | Zn | Sn | 1 | 1/2 |
| 91 | 0.0025 | 0.565 | 0.040 | 0.995 | 0.10 | 0.06 | 0.50 | — | 0.50 | — | Zn | Sn | 1 | 1/2 |
| 92 | 0.0025 | 0.565 | 0.040 | 0.995 | 0.10 | 0.06 | 0.50 | — | — | 0.50 | Zn | Sn | 1 | 1/2 |
| 93 | 0.0025 | 0.565 | 0.040 | 0.995 | 0.10 | 0.06 | 0.75 | 0.25 | — | — | Zn | Sn | 1 | 1/2 |
| 94 | 0.0025 | 0.565 | 0.040 | 0.995 | 0.10 | 0.06 | 0.75 | — | 0.25 | — | Zn | Sn | 1 | 1/2 |
| 95 | 0.0025 | 0.565 | 0.040 | 0.995 | 0.10 | 0.06 | 0.75 | — | — | 0.25 | Zn | Sn | 1 | 1/2 |
| 96 | 0.0025 | 0.565 | 0.040 | 0.995 | 0.10 | 0.06 | 0.25 | 0.25 | 0.25 | 0.25 | Zn | Sn | 1 | 1/2 |
| 97 | 0.0025 | 0.565 | 0.040 | 0.990 | 0.10 | 0.06 | 1.00 | — | — | — | Zn | Sn | 1 | 1/2 |
| 98 | 0.0025 | 0.565 | 0.040 | 0.990 | 0.10 | 0.06 | — | 1.00 | — | — | Zn | Sn | 1 | 1/2 |
| 99 | 0.0025 | 0.565 | 0.040 | 0.990 | 0.10 | 0.06 | — | — | 1.00 | — | Zn | Sn | 1 | 1/2 |
| 100 | 0.0025 | 0.565 | 0.040 | 0.990 | 0.10 | 0.06 | — | — | — | 1.00 | Zn | Sn | 1 | 1/2 |
| 101 | 0.0025 | 0.565 | 0.040 | 0.990 | 0.10 | 0.06 | 1.00 | — | — | — | Zn | Sn | 1 | 1/2 |
| 102 | 0.0025 | 0.565 | 0.040 | 0.990 | 0.10 | 0.06 | — | 1.00 | — | — | Zn | Sn | 1 | 1/2 |
| 103 | 0.0025 | 0.565 | 0.040 | 0.990 | 0.10 | 0.06 | — | — | 1.00 | — | Zn | Sn | 1 | 1/2 |
| 104 | 0.0025 | 0.565 | 0.040 | 0.990 | 0.10 | 0.06 | — | — | — | 1.00 | Zn | Sn | 1 | 1/2 |
| 105 | 0.0025 | 0.565 | 0.040 | 0.990 | 0.10 | 0.06 | 0.25 | 0.75 | — | — | Zn | Sn | 1 | 1/2 |
| 106 | 0.0025 | 0.565 | 0.040 | 0.990 | 0.10 | 0.06 | 0.25 | — | 0.75 | — | Zn | Sn | 1 | 1/2 |
| 107 | 0.0025 | 0.565 | 0.040 | 0.990 | 0.10 | 0.06 | 0.25 | — | — | 0.75 | Zn | Sn | 1 | 1/2 |
| 108 | 0.0025 | 0.565 | 0.040 | 0.990 | 0.10 | 0.06 | 0.50 | 0.50 | — | — | Zn | Sn | 1 | 1/2 |
| 109 | 0.0025 | 0.565 | 0.040 | 0.990 | 0.10 | 0.06 | 0.50 | — | 0.50 | — | Zn | Sn | 1 | 1/2 |
| 110 | 0.0025 | 0.565 | 0.040 | 0.990 | 0.10 | 0.06 | 0.50 | — | — | 0.50 | Zn | Sn | 1 | 1/2 |
| 111 | 0.0025 | 0.565 | 0.040 | 0.990 | 0.10 | 0.06 | 0.75 | 0.25 | — | — | Zn | Sn | 1 | 1/2 |
| 112 | 0.0025 | 0.565 | 0.040 | 0.990 | 0.10 | 0.06 | 0.75 | — | 0.25 | — | Zn | Sn | 1 | 1/2 |
| 113 | 0.0025 | 0.565 | 0.040 | 0.990 | 0.10 | 0.06 | 0.75 | — | — | 0.25 | Zn | Sn | 1 | 1/2 |
| 114 | 0.0025 | 0.565 | 0.040 | 0.990 | 0.10 | 0.06 | 0.25 | 0.25 | 0.25 | 0.25 | Zn | Sn | 1 | 1/2 |

| Sample No. | Formulation Composition | | $d_{31}$ [pm/V] | Phase transition point [° C.] | Rate of change of $d_{31}$ after temperature cycle Connection with support body | | |
|---|---|---|---|---|---|---|---|
| | $MnO_2$ [Parts by mass] | $Cr_2O_3$ [Parts by mass] | | | Absence | Presence | Difference |
| 83 | 0.25 | — | 103 | −10 | −4.2% | −5.7% | −1.5% |
| 84 | 0.25 | — | 116 | −33 | −3.1% | −3.2% | −0.1% |
| 85 | 0.25 | — | 108 | −30 | −3.2% | −3.2% | 0.0% |
| 86 | 0.25 | — | 115 | −33 | −3.1% | −3.2% | −0.1% |
| 87 | 0.25 | — | 113 | −27 | −3.3% | −3.3% | 0.0% |
| 88 | 0.25 | — | 107 | −25 | −3.5% | −3.6% | −0.1% |
| 89 | 0.25 | — | 112 | −27 | −3.3% | −3.4% | −0.1% |
| 90 | 0.25 | — | 109.5 | −22 | −3.6% | −3.7% | −0.1% |
| 91 | 0.25 | — | 105.5 | −20 | −3.7% | −3.7% | 0.0% |
| 92 | 0.25 | — | 109 | −22 | −3.6% | −3.7% | −0.1% |
| 93 | 0.25 | — | 106 | −16 | −3.9% | −5.1% | −1.2% |
| 94 | 0.25 | — | 104 | −15 | −4.0% | −5.2% | −1.2% |
| 95 | 0.25 | — | 106 | −16 | −3.9% | −5.1% | −1.2% |
| 96 | 0.25 | — | 111 | −38 | −2.8% | −2.9% | −0.1% |
| 97 | 0.25 | — | 101 | −21 | −3.2% | −3.4% | −0.2% |
| 98 | 0.25 | — | 114 | −43 | −2.4% | −2.6% | −0.2% |
| 99 | 0.25 | — | 105 | −41 | −2.6% | −2.7% | −0.1% |
| 100 | 0.25 | — | 113 | −45 | −2.2% | −2.5% | −0.3% |

TABLE 3-continued

| | | | | | | | |
|---|---|---|---|---|---|---|---|
| 101 | — | 0.50 | 105 | −27 | −3.0% | −3.1% | −0.1% |
| 102 | — | 0.50 | 117 | −46 | −2.2% | −2.3% | −0.1% |
| 103 | — | 0.50 | 110 | −45 | −2.4% | −2.5% | −0.1% |
| 104 | — | 0.50 | 116 | −50 | −2.0% | −2.1% | −0.1% |
| 105 | 0.25 | — | 111 | −38 | −2.8% | −3.0% | −0.2% |
| 106 | 0.25 | — | 104 | −36 | −2.9% | −3.1% | −0.2% |
| 107 | 0.25 | — | 110 | −39 | −2.8% | −2.8% | 0.0% |
| 108 | 0.25 | — | 108 | −32 | −3.1% | −3.2% | −0.1% |
| 109 | 0.25 | — | 103 | −31 | −3.2% | −3.2% | 0.0% |
| 110 | 0.25 | — | 107 | −33 | −3.1% | −3.2% | −0.1% |
| 111 | 0.25 | — | 104 | −27 | −3.4% | −3.5% | −0.1% |
| 112 | 0.25 | — | 102 | −26 | −3.4% | −3.5% | −0.1% |
| 113 | 0.25 | — | 104 | −27 | −3.4% | −3.5% | −0.1% |
| 114 | 0.25 | — | 108 | −38 | −2.8% | −2.8% | 0.0% |

The Samples indicated with * are out of the range of the present invention.

As shown in FIG. 6, when the phase transition point is higher than −20° C., the decrease rate after the temperature cycle in the piezoelectric actuator substrate 21 subjected to the compressive stress by the connection is 1% or more larger than that in the piezoelectric actuator substrate 21 subjected to no compressive stress by the connection. This shows that large variations in piezoelectric constant d31 occur under the compressive stress. In contrast, in the samples whose phase transition point is −20° C. or below, variations in piezoelectric constant d31 stays about the same depending on a difference in compressive stress (approximately ±0.1% that is approximately a measurement error). This shows that the variations in piezoelectric constant d31 is minimized.

In the samples in the range of 0.0024≤x≤0.008, 0.66≤a+3×b≤0.74, 0.02≤b≤0.10, 0.980≤c≤1.000, 0.04≤d≤0.10, 0≤e≤0.08, ⅔≤α≤1, and ⅓≤β≤⅔ in the foregoing composition formula, the piezoelectric constant d31 is as high as 90 pm/V or higher.

Some of the samples were also subjected to a similar test using SUS304 as the support body. The results thereof are presented in Table 4. Even in the case of being connected to the SUS304, variations in piezoelectric constant d31 is minimized in the piezoelectric actuator substrate 21, whose phase transition point is −20° C. or below.

TABLE 4

| Sample No. | d31 [pm/V] | Phase transition point [° C.] | Rate of change of d31 after temperature cycle Connection with support body (SUS304) | | |
|---|---|---|---|---|---|
| | | | Absence | Presence | Difference |
| 14 | 97 | −20 | −3.4% | −3.8% | −0.4% |
| * 15 | 115 | 2 | −4.1% | −7.8% | −3.7% |
| 23 | 80 | −31 | −3.1% | −3.3% | −0.2% |
| * 24 | 94 | −3 | −3.9% | −6.8% | −2.9% |
| 28 | 112 | −20 | −3.4% | −3.6% | −0.2% |
| 38 | 92 | −32 | −2.1% | −2.1% | 0.0% |
| 39 | 97 | −38 | −1.9% | −1.9% | 0.0% |
| 40 | 90 | −37 | −2.9% | −2.9% | 0.0% |
| 41 | 89 | −35 | −3.0% | −2.9% | 0.1% |
| 42 | 94 | −34 | −2.5% | −2.6% | −0.1% |
| 43 | 101 | −31 | −2.6% | −2.7% | −0.1% |
| * 44 | 100 | 0 | −6.1% | −8.1% | −2.0% |
| 45 | 123 | −32 | −4.5% | −4.4% | 0.1% |
| 46 | 114 | −35 | −4.3% | −4.3% | 0.0% |
| 47 | 91 | −52 | −1.5% | −1.6% | −0.1% |
| 48 | 115 | −33 | −3.0% | −3.0% | 0.0% |
| 49 | 94 | −43 | −2.7% | −2.8% | −0.1% |
| 50 | 91 | −48 | −2.5% | −2.6% | −0.1% |
| 51 | 101 | −43 | −1.7% | −1.8% | −0.1% |
| 52 | 98 | −46 | −2.3% | −2.3% | 0.0% |
| 53 | 95 | −53 | −2.0% | −1.9% | 0.1% |
| 54 | 99 | −41 | −2.2% | −2.2% | 0.0% |
| 55 | 105 | −28 | −3.1% | −3.1% | 0.0% |
| 56 | 102 | −30 | −3.8% | −3.9% | −0.1% |
| 57 | 100 | −22 | −4.1% | −4.1% | 0.0% |
| 58 | 108 | −24 | −4.2% | −4.2% | 0.0% |
| 59 | 110 | −22 | −3.6% | −3.6% | 0.0% |
| 60 | 111 | −23 | −3.5% | −3.5% | 0.0% |
| 61 | 107 | −26 | −3.5% | −3.4% | 0.1% |
| 62 | 107 | −25 | −4.0% | −4.0% | 0.0% |
| 63 | 113 | −21 | −3.9% | −4.0% | −0.1% |
| 64 | 112 | −22 | −3.6% | −3.7% | −0.1% |
| 65 | 110 | −23 | −3.2% | −3.1% | 0.1% |
| 66 | 118 | −20 | −3.9% | −3.9% | 0.0% |
| 67 | 115 | −21 | −3.7% | −3.7% | 0.0% |

The Samples indicated with * are out of the range of the present invention.

Furthermore, some of the samples were measured in terms of crystal axis ratio and a compressive stress when the potassium sodium niobate composition was in the tetragonal crystal system. The results thereof are presented in Table 5.

TABLE 5

| Sample No. | Crystal axis ratio c/a — | Compressive stress | |
|---|---|---|---|
| | | Support body SUS430 [MPa] | Suppport body SUS304 [MPa] |
| 14 | 1.0115 | 30 | 80 |
| * 15 | 1.0075 | 30 | 80 |
| 23 | 1.0135 | 30 | 80 |
| * 24 | 1.0112 | 30 | 80 |
| 28 | 1.0106 | 30 | 80 |

The Samples indicated with * are out of the range of the present invention.

DESCRIPTION OF REFERENCE NUMERALS 1 color inkjet printer
2 liquid discharge head
2a head body
4 flow channel member (support body)
4a-4l plates (of flow channel member)
4-1 discharge hole surface
4-2 pressurizing chamber surface 5 manifold
5a opening (of manifold)
5b sub manifold
6 aperture
8 discharge hole
9 discharge hole row
10 pressurizing chamber
11 pressurizing chamber row
12 individual flow channel
15 partition wall
14 individual supply flow channel
16 dummy pressurizing chamber
21 piezoelectric actuator substrate
21a piezoelectric ceramic layer (diaphragm)
21b piezoelectric ceramic layer
24 common electrode
25 individual electrode
25a individual electrode body
25b extracting electrode
26 connection electrode
28 surface electrode for common electrode
30 displacement element (piezoelectric element)
60 signal transmission section
70 head-mounted frame
72 head group
80a paper feed roller
80b recovery roller
82a guide roller
82b transport roller
88 control section
P printing paper

The invention claimed is:

1. A piezoelectric element comprising:
a piezoelectric body containing a potassium sodium niobate composition as a primary component,
wherein the piezoelectric body extends in a planar direction and is subjected to a compressive stress in the planar direction, and a phase transition point between a tetragonal crystal system and an orthorhombic crystal system is −20° C. or below.

2. The piezoelectric element according to claim 1, wherein when the potassium sodium niobate composition is expressed by a composition formula: $(1-x)\{(K_{1-a}Na_a)_{1-b}Li_b\}_c(Nb_{1-d-e}Ta_dSb_e)O_{2.5+C/2}+xB1_\alpha(Al_{1-\beta}A2_\beta)O_3$, 0.0024≤x≤0.008,
0.66≤a+3×b≤0.74,
0.02≤b≤0.10,
0.980≤c≤1.000,
0.04≤d≤0.10,
0≤e≤0.08,
⅔≤α≤1, and
⅓≤β≤⅔, and wherein A1 is at least one selected from an element group consisting of Mg, Cu, and Zn, A2 is at least one selected from an element group consisting of Nb, Ta, Sb, Ti, Zr, Hf, Ge, Sn, and Ce, and B1 is at least one selected from an element group consisting of Bi, Ca, Ba, and Sr.

3. The piezoelectric element according to claim 2, wherein a crystal axis ratio c/a in the tetragonal crystal system of the potassium sodium niobate composition is 1.01 or more.

4. A piezoelectric member comprising:
the piezoelectric element according to claim 2; and
a support body that is connected to the piezoelectric body and has a larger coefficient of thermal expansion than the piezoelectric body.

5. The piezoelectric element according to claim 1, wherein a crystal axis ratio c/a in the tetragonal crystal system of the potassium sodium niobate composition is 1.01 or more.

6. A piezoelectric member comprising:
the piezoelectric element according to claim 1; and
a support body that is connected to the piezoelectric body and has a larger coefficient of thermal expansion than the piezoelectric body.

* * * * *